(12) United States Patent
Yamane et al.

(10) Patent No.: US 11,621,688 B2
(45) Date of Patent: Apr. 4, 2023

(54) ACOUSTIC WAVE DEVICE

(71) Applicant: Murata Manufacturing Co., Ltd., Nagaokakyo (JP)

(72) Inventors: Takashi Yamane, Nagaokakyo (JP); Tetsuya Kimura, Nagaokakyo (JP); Sho Nagatomo, Nagaokakyo (JP); Katsuya Daimon, Nagaokakyo (JP); Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/704,519

(22) Filed: Mar. 25, 2022

(65) Prior Publication Data

US 2022/0216844 A1 Jul. 7, 2022

Related U.S. Application Data

(63) Continuation of application No. PCT/JP2020/036401, filed on Sep. 25, 2020.

(30) Foreign Application Priority Data

Sep. 27, 2019 (JP) .............................. JP2019-178097

(51) Int. Cl.
*H03H 9/02* (2006.01)
*H03H 9/13* (2006.01)
*H03H 9/17* (2006.01)
*H03H 9/56* (2006.01)

(52) U.S. Cl.
CPC .... *H03H 9/02149* (2013.01); *H03H 9/02031* (2013.01); *H03H 9/02228* (2013.01);
(Continued)

(58) Field of Classification Search
CPC ........... H03H 9/02149; H03H 9/02031; H03H 9/02228; H03H 9/132; H03H 9/174;
(Continued)

(56) References Cited

U.S. PATENT DOCUMENTS

2007/0069837 A1* 3/2007 Nishimura ......... H03H 9/14588
333/195
2010/0223999 A1 9/2010 Onoe
(Continued)

FOREIGN PATENT DOCUMENTS

| JP | 2013-528996 A | 7/2013 |
| JP | 2019-062441 A | 4/2019 |

(Continued)

OTHER PUBLICATIONS

Office Action in KR10-2022-7010122, dated Aug. 25, 2022, 3 pages.
Official Communication issued in International Patent Application No. PCT/JP2020/036401 dated Dec. 15, 2020.

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An acoustic wave device includes a piezoelectric layer and first and second electrodes. The first and second electrodes face each other in a direction intersecting with a thickness direction of the piezoelectric layer. The acoustic wave device uses a bulk wave of a thickness-shear primary mode. A material of the piezoelectric layer is lithium niobate or lithium tantalate. The piezoelectric layer is on a first main surface of the silicon substrate. The acoustic wave device further includes a trap region on a side of a second main surface of the piezoelectric layer.

20 Claims, 26 Drawing Sheets

(52) U.S. Cl.
CPC ............ *H03H 9/132* (2013.01); *H03H 9/174* (2013.01); *H03H 9/175* (2013.01); *H03H 9/176* (2013.01); *H03H 9/562* (2013.01); *H03H 9/564* (2013.01); *H03H 9/568* (2013.01)

(58) Field of Classification Search
CPC ........ H03H 9/175; H03H 9/176; H03H 9/562; H03H 9/564; H03H 9/568; H03H 9/02047; H03H 9/02102; H03H 9/02157; H03H 9/02015; H03H 9/171; H03H 9/02559; H03H 9/02622; H03H 9/145; H03H 9/703
USPC .......................................... 333/133, 193–196
See application file for complete search history.

(56) References Cited

U.S. PATENT DOCUMENTS

| | | |
|---|---|---|
| 2013/0057360 A1 | 3/2013 | Meltaus et al. |
| 2014/0139075 A1* | 5/2014 | Iwamoto .................. H03H 3/04 29/25.35 |
| 2016/0277003 A1 | 9/2016 | Kikuchi et al. |
| 2017/0250671 A1 | 8/2017 | Omura et al. |
| 2019/0097602 A1 | 3/2019 | Kimura |
| 2019/0372552 A1 | 12/2019 | Gaudin et al. |

FOREIGN PATENT DOCUMENTS

| | | |
|---|---|---|
| KR | 10-2019-0025649 A | 3/2019 |
| WO | 2015/098678 A1 | 7/2015 |
| WO | 2016/098526 A1 | 6/2016 |

* cited by examiner

ACOUSTIC WAVE DEVICE

CROSS REFERENCE TO RELATED APPLICATIONS

This application claims the benefit of priority to Japanese Patent Application No. 2019-178097 filed on Sep. 27, 2019 and is a Continuation Application of PCT Application No. PCT/JP2020/036401 filed on Sep. 25, 2020. The entire contents of each application are hereby incorporated herein by reference.

BACKGROUND OF THE INVENTION

1. Field of the Invention

The present invention relates to an acoustic wave device, and more particularly to an acoustic wave device including a piezoelectric layer.

2. Description of the Related Art

Conventionally, a surface acoustic wave device including a support substrate, a low acoustic velocity film, a piezoelectric thin film, and an IDT electrode has been known (for example, see International Publication No. 2015/098678).

A material of the support substrate is, for example, silicon. A material of the low acoustic velocity film is, for example, silicon oxide. A material of the piezoelectric thin film is, for example, $LiTaO_3$.

For a surface acoustic wave device disclosed in International Publication No. 2015/098678, it is difficult to cope with a further increase in frequency. Additionally, with the surface acoustic wave device disclosed in International Publication No. 2015/098678, linearity may be degraded due to harmonic distortion, intermodulation distortion (IMD), or the like.

SUMMARY OF THE INVENTION

Preferred embodiments of the present invention provide acoustic wave devices that are each able to handle higher frequencies and achieve improved linearity.

An acoustic wave device according to a preferred embodiment of the present invention includes a piezoelectric layer, and a first electrode and a second electrode. The first electrode and the second electrode face each other in a direction intersecting with a thickness direction of the piezoelectric layer. The acoustic wave device uses a bulk wave of a thickness-shear primary mode. The acoustic wave device further includes a silicon substrate. The silicon substrate includes a first main surface and a second main surface opposed to each other. A material of the piezoelectric layer is lithium niobate or lithium tantalate. The piezoelectric layer is on the first main surface of the silicon substrate. The acoustic wave device further includes a trap region in the silicon substrate.

An acoustic wave device according to a preferred embodiment of the present invention includes a piezoelectric layer, and a first electrode and a second electrode. The first electrode and the second electrode face each other in a direction intersecting with a thickness direction of the piezoelectric layer. The first electrode and the second electrode are adjacent to each other. In the acoustic wave device, in any cross section along the thickness direction of the piezoelectric layer, d/p is equal to or less than about 0.5, when a distance between center lines of the first electrode and the second electrode is represented by p, and a thickness of the piezoelectric layer is represented by d. The acoustic wave device further includes a silicon substrate. The silicon substrate includes a first main surface and a second main surface opposed to each other. A material of the piezoelectric layer is lithium niobate or lithium tantalate. The piezoelectric layer is on the first main surface of the silicon substrate. The acoustic wave device further includes a trap region in the silicon substrate.

With each of the acoustic wave devices according to preferred embodiments of the present invention, it is possible to handle higher frequencies and improve linearity.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

FIGS. 1 to 8, 13, 14, and 16 to 28C are schematic diagrams, and ratios of sizes and thicknesses of respective elements and portions in the diagrams do not necessarily reflect actual dimensional ratios.

Preferred Embodiment 1

Hereinafter, an acoustic wave device 1 according to Preferred Embodiment 1 of the present invention will be described with reference to FIGS. 1 to 5.

(1.1) Overall Configuration of Acoustic Wave Device

Figure 1:
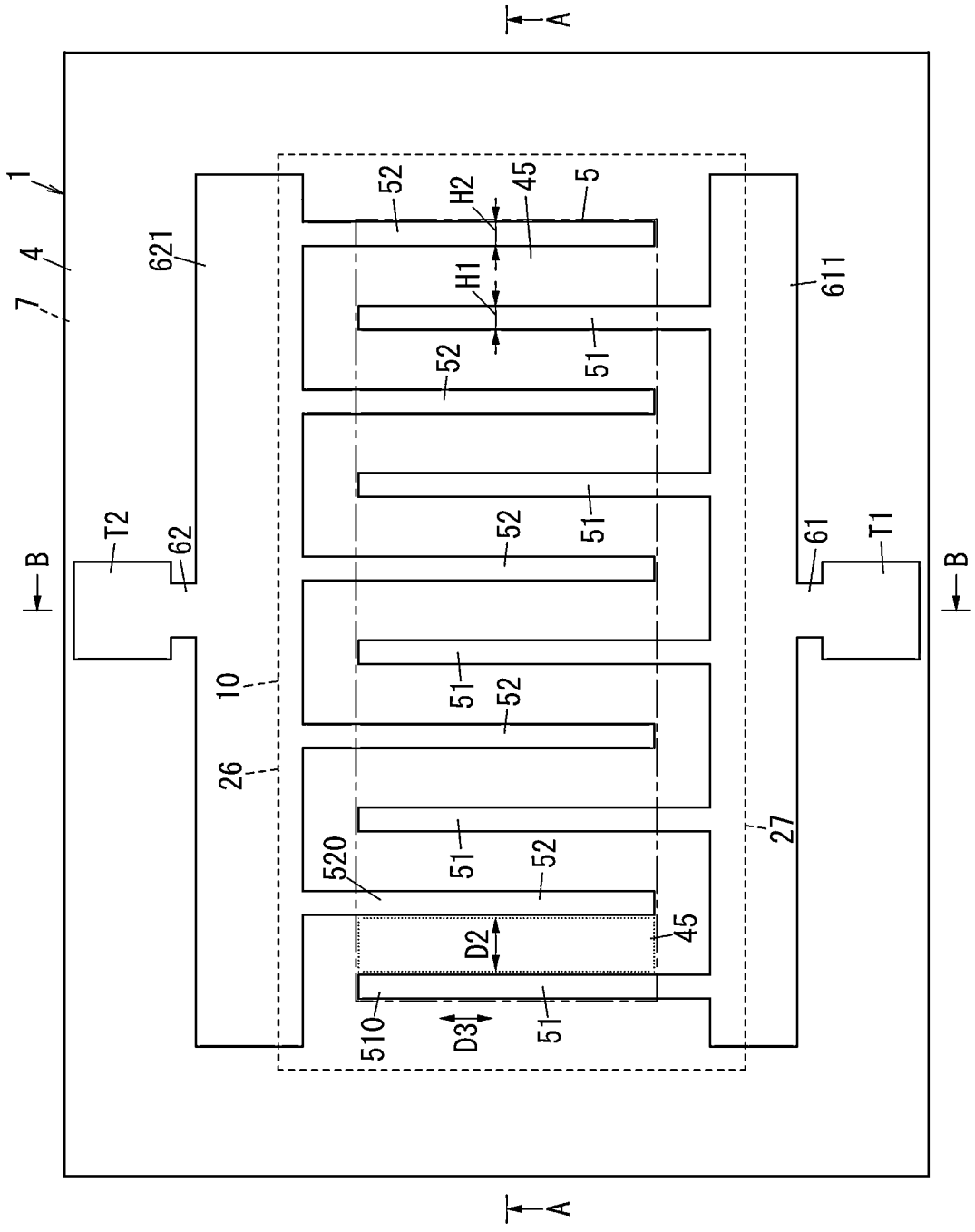
FIG. 1 is a plan view of an acoustic wave device according to Preferred Embodiment 1 of the present invention.
Figure 2:
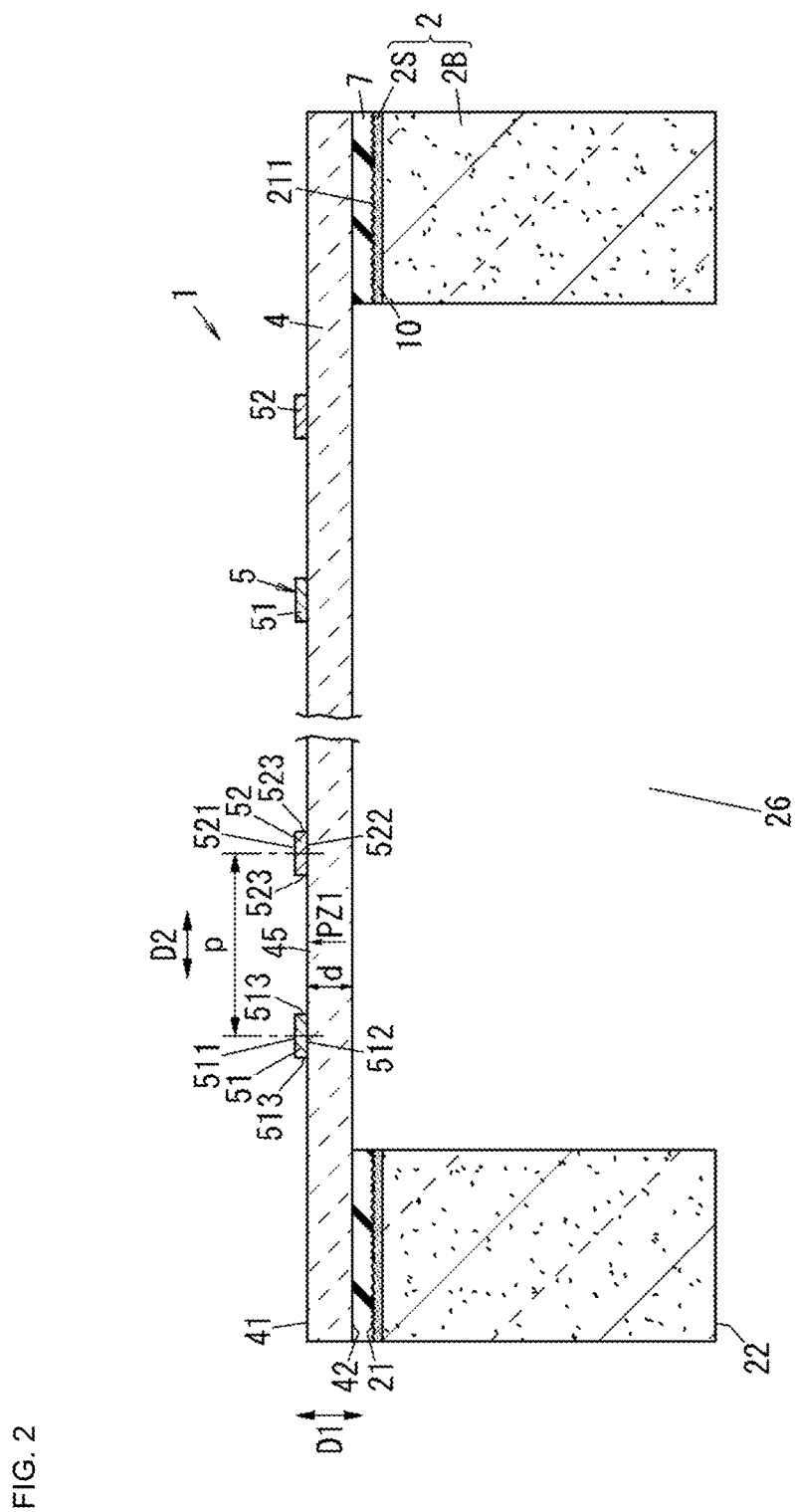
FIG. 2 is a cross-sectional view of the acoustic wave device taken along a line A-A of FIG. 1.
Figure 3:
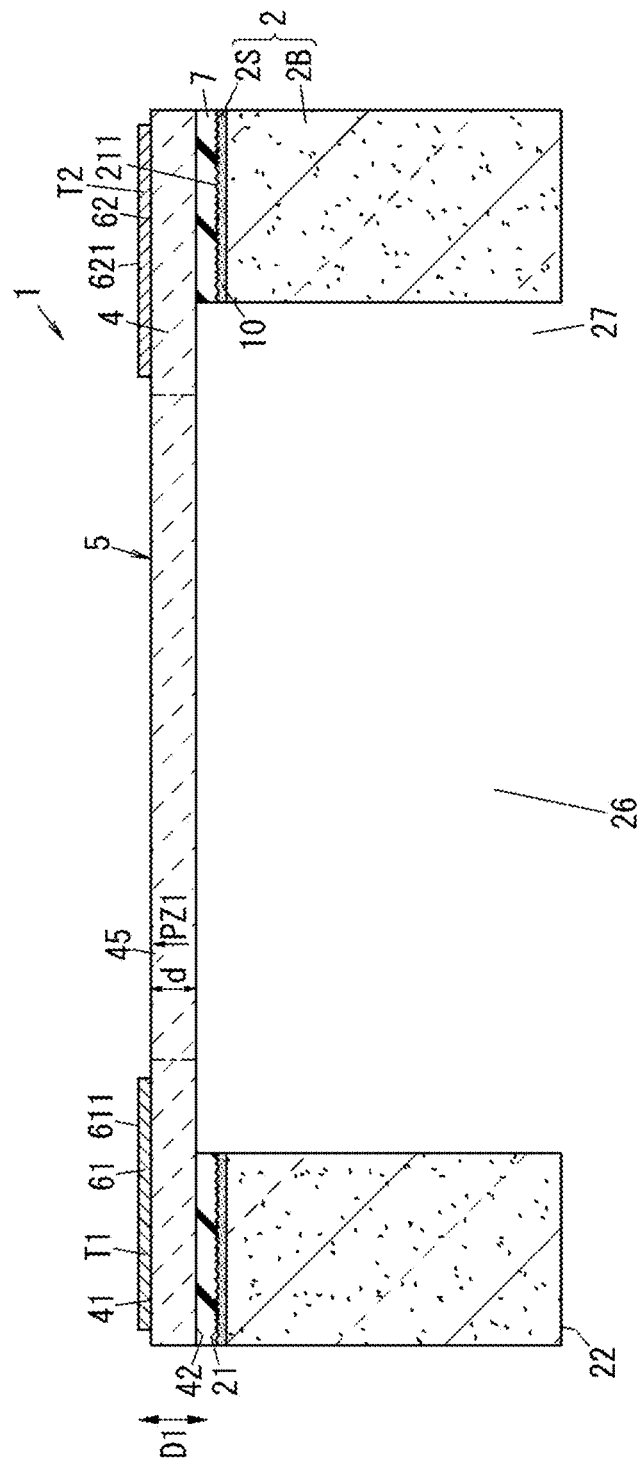
FIG. 3 is a cross-sectional view of the acoustic wave device taken along a line B-B of FIG. 1.
Figure 4:
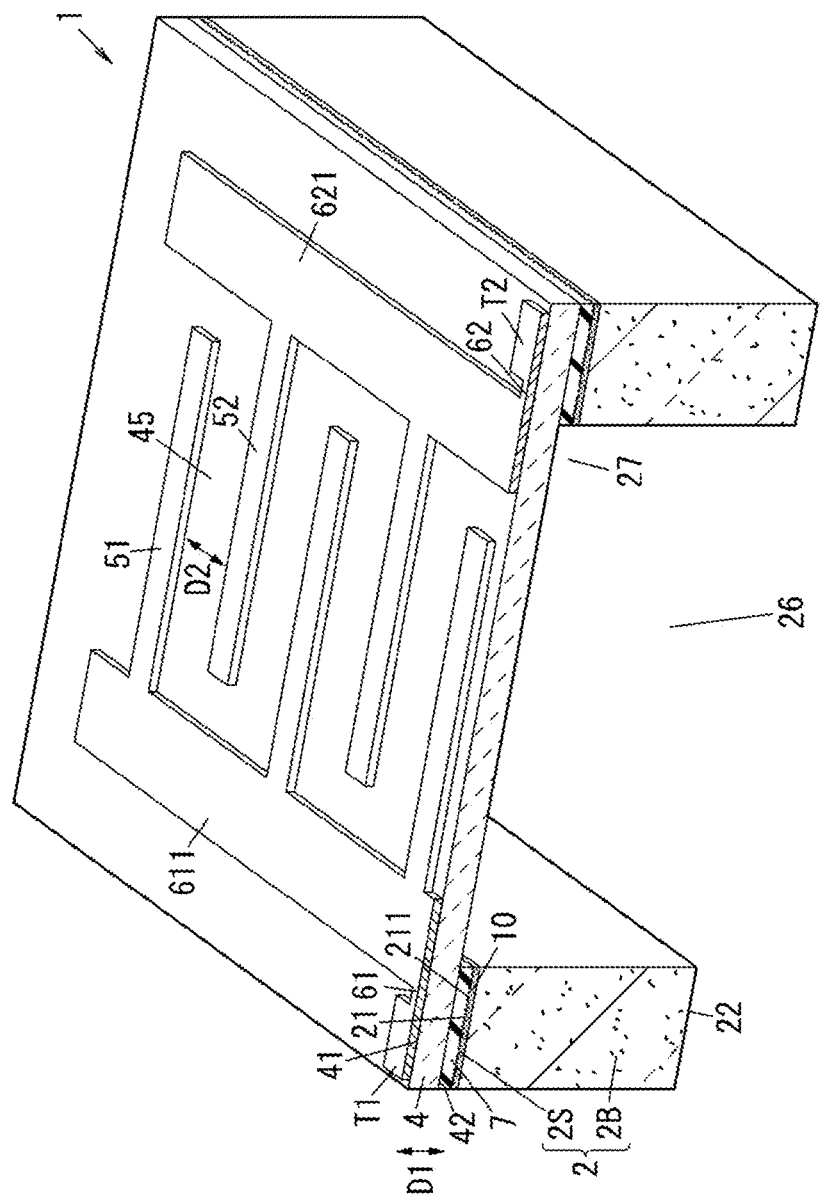
FIG. 4 is a partially cutaway perspective view of the acoustic wave device according to Preferred Embodiment 1 of the present invention.
Figure 5:
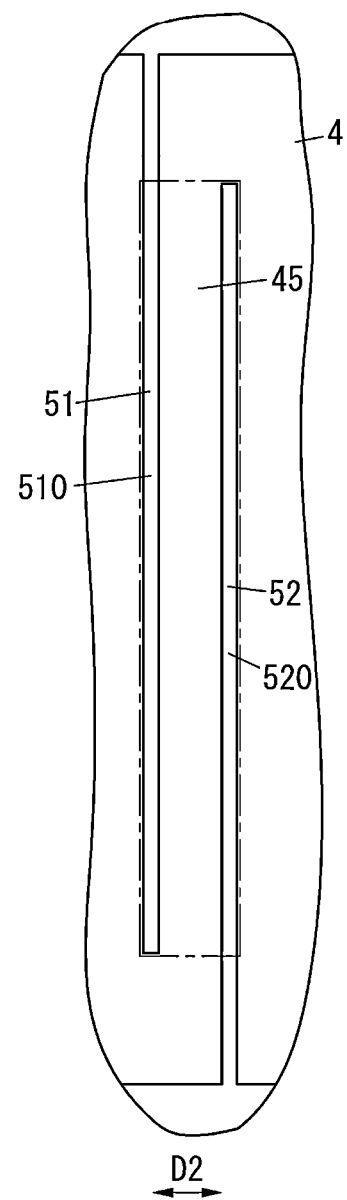
FIG. 5 is a plan view of a main portion of the acoustic wave device according to Preferred Embodiment 1 of the present invention.

As illustrated in FIG. 1, the acoustic wave device 1 according to Preferred Embodiment 1 includes a piezoelectric layer 4, and a first electrode 51 and a second electrode 52. As illustrated in FIG. 2, the first electrode 51 and the second electrode 52 face each other in a direction D2 (hereinafter, also referred to as a second direction D2) intersecting with a thickness direction D1 (hereinafter, also referred to as a first direction D1) of the piezoelectric layer 4. The acoustic wave device 1 uses a bulk wave of a thickness-shear primary mode. The second direction D2 is orthogonal to a polarization direction PZ1 of the piezoelectric layer 4. The bulk wave of the thickness-shear primary mode is a bulk wave whose propagation direction is the thickness direction D1 of the piezoelectric layer 4 due to thickness-shear vibration of the piezoelectric layer 4 and whose number of nodes in the thickness direction D1 of the piezoelectric layer 4 is one. The thickness-shear vibration is excited by the first electrode 51 and the second electrode 52. The thickness-shear vibration is excited, in the piezoelectric layer 4, in a specified region 45 between the first electrode 51 and the second electrode 52 in a plan view from the thickness direction D1. In the acoustic wave device 1, when the second direction D2 is orthogonal to the polarization direction PZ1 of the piezoelectric layer 4, an electromechanical coupling coefficient (hereinafter, also referred to as a coupling coefficient) of the bulk wave of the thickness-shear primary mode is large. Here, "orthogonal" is not limited to a case of being strictly orthogonal, and may be substantially orthogonal (an angle between the second direction D2 and the polarization direction PZ1 is, for example, about 90°±10°).

As illustrated in FIGS. 1 and 2, the acoustic wave device 1 includes a plurality of first electrodes 51 and a plurality of second electrodes 52. That is, when the first electrode 51 and the second electrode 52 define and function as an electrode set defining a pair of electrodes, the acoustic wave device 1 includes a plurality of electrode sets each of which includes a pair of the first electrode 51 and the second electrode 52. In the acoustic wave device 1, the plurality of first electrodes 51 and the plurality of second electrodes 52 are alternately provided one by one in the second direction D2. As illustrated in FIG. 1, the acoustic wave device 1 further includes a first wiring portion 61 connected to the first electrode 51 and a second wiring portion 62 connected to the second electrode 52. The first wiring portion 61 is connected to a first terminal T1. The second wiring portion 62 is connected to a second terminal T2 different from the first terminal T1. The plurality of first electrodes 51 are commonly connected to the first wiring portion 61. The plurality of second electrodes 52 are commonly connected to the second wiring portion 62.

As illustrated in FIG. 2, the acoustic wave device 1 includes, for example, a silicon substrate 2, the piezoelectric layer 4, the plurality of first electrodes 51, and the plurality of second electrodes 52. The piezoelectric layer 4 is provided on the silicon substrate 2. As an example, the piezoelectric layer 4 is provided on the silicon substrate 2 with a silicon oxide film 7 interposed therebetween. The plurality of first electrodes 51 and the plurality of second electrodes 52 are provided on the piezoelectric layer 4. The acoustic wave device 1 includes, as a resonator, an acoustic wave resonator 5 including the first electrode 51 and the second electrode 52, and the piezoelectric layer 4. The silicon substrate 2 includes at least a portion of a cavity 26 facing a portion of the piezoelectric layer 4. The cavity 26 overlaps the plurality of first electrodes 51 and the plurality of second electrodes 52 in a plan view from the thickness direction D1 of the piezoelectric layer 4. Here, the cavity 26 overlaps the plurality of first electrodes 51, the plurality of second electrodes 52, and a plurality of specified regions 45 in a plan view from the thickness direction D1 of the piezoelectric layer 4. Each of the plurality of regions 45 is a portion between the first electrode 51 and the second electrode 52 that are adjacent to each other. The first electrode 51 and the second electrode 52 are "adjacent to each other" refers to a case where the first electrode 51 and the second electrode 52 face each other with an interval interposed therebetween.

The acoustic wave device 1 further includes a trap region 10 (see FIGS. 2 to 4) that reduces or prevents movement of charges.

(1.2) Elements of Acoustic Wave Device

Next, elements of the acoustic wave device 1 will be described with reference to the drawings.

(1.2.1) Silicon Substrate

As illustrated in FIG. 2, the silicon substrate 2 supports the piezoelectric layer 4. In the acoustic wave device 1 according to Preferred Embodiment 1, the silicon substrate 2 supports the piezoelectric layer 4, the plurality of first electrodes 51, and the plurality of second electrodes 52 with the silicon oxide film 7 interposed therebetween.

The silicon substrate 2 includes a first main surface 21 and a second main surface 22 that are opposed to each other. The first main surface 21 and the second main surface 22 are opposed to each other in a thickness direction of the silicon substrate 2. The thickness direction of the silicon substrate 2 is a direction along the thickness direction D1 of the piezoelectric layer 4. In a plan view from the thickness direction D1 of the piezoelectric layer 4, an outer peripheral shape of the silicon substrate 2 is a rectangular or substantially rectangular shape, but is not limited thereto, and may be, for example, a square or substantially square shape.

The thickness of the silicon substrate 2 is, for example, equal to or more than about 100 μm and equal to or less than about 500 μm. The silicon substrate 2 is a single-crystal silicon substrate including a first main surface and a second main surface that are opposed to each other. As a plane orientation of the first main surface of the single-crystal silicon substrate, for example, a (100) plane, a (110) plane, or a (111) plane may be used. A propagation orientation of the bulk wave described above can be set without being restricted by the plane orientation of the single-crystal silicon substrate. A resistivity of the single-crystal silicon substrate is, for example, equal to or more than 1 kΩcm, preferably equal to or more than about 2 kΩcm, and more preferably equal to or more than about 4 kΩcm.

The first main surface 21 of the silicon substrate 2 includes a rough surface 211. The rough surface 211 is formed by roughening the first main surface of the single-crystal silicon substrate. In the acoustic wave device 1 according to Preferred Embodiment 1, the entire or substantially the entire first main surface 21 of the silicon substrate 2 is the rough surface 211. The rough surface 211 does not overlap the acoustic wave resonator in a plan view from the thickness direction D1 of the piezoelectric layer 4. The silicon substrate 2 includes a bulk region 2B and a surface region 2S. The bulk region 2B is positioned on a side of the surface region 2S opposite to the piezoelectric layer 4 side. The surface region 2S is, for example, an amorphous silicon layer. The amorphous silicon layer is formed, for example, by degrading a lattice structure of the single-crystal silicon substrate when the first main surface of the single-crystal silicon substrate is roughened. The surface region 2S includes the first main surface 21 of the silicon substrate 2. The surface region 2S has a thickness, for example, equal to or more than about 1 nm and equal to or less than about 700 nm. The bulk region 2B is, for example, a single-crystal silicon layer. The single-crystal silicon layer is a remaining portion of the single-crystal silicon substrate when the surface region 2S is provided in the single-crystal silicon substrate. The bulk region 2B includes the second main surface 22 of the silicon substrate 2. In the acoustic wave device 1, the trap region 10 includes the surface region 2S. The surface region 2S is not limited to an amorphous silicon layer and may be, for example, a polycrystalline silicon layer. The surface region 2S can be formed, for example, by grinding a portion of the single-crystal silicon substrate from the first main surface of the single-crystal silicon substrate, but the forming method is not limited thereto. The surface region 2S may be, for example, an amorphous silicon layer or a polycrystalline silicon layer deposited on the single-crystal silicon substrate defining the bulk region 2B. In the silicon substrate 2, when the surface region 2S is an amorphous silicon layer or a polycrystalline silicon layer deposited on the bulk region 2B, the first main surface 21 of the silicon substrate 2 may include the rough surface 211 or does not need to include the rough surface 211. Further, the surface region 2S may be formed, for example, by implanting ions of at least one type of element selected from a group of argon, silicon, oxygen, and carbon into the single-crystal silicon substrate from the first main surface of the single-crystal silicon substrate. Further, the surface region 2S may be formed, for example, by irradiating the single-crystal silicon substrate with radiation from the first main surface of the single-crystal silicon substrate. When the surface region 2S is formed by ion implantation or radiation irradiation, the first main surface 21 of the silicon substrate 2 may include the rough surface 211 or does not need to include the rough surface 211.

The silicon substrate 2 includes at least a portion of the cavity 26 facing the second main surface 42 of the piezoelectric layer 4. The cavity 26 is positioned on a side opposite to the first electrode 51 and the second electrode 52 with the piezoelectric layer 4 interposed therebetween. The cavity 26 overlaps the acoustic wave resonator 5 in a plan view from the thickness direction D1 of the piezoelectric layer 4. In the acoustic wave device 1 according to Preferred Embodiment 1, the cavity 26 is larger than the acoustic wave resonator 5 and overlaps the entire or substantially the entire acoustic wave resonator 5 in a plan view from the thickness direction D1 of the piezoelectric layer 4. Additionally, in the acoustic wave device 1 according to Preferred Embodiment 1, the cavity 26 also overlaps a portion of each of the first wiring portion 61 and the second wiring portion in a plan view from the thickness direction D1 of the piezoelectric layer 4. An opening shape of the cavity 26 in a plan view from the thickness direction D1 of the piezoelectric layer 4 is, for example, a rectangular or substantially rectangular shape, but is not limited thereto.

(1.2.2) Silicon Oxide Film

The silicon oxide film 7 is provided between the first main surface 21 of the silicon substrate 2 and the piezoelectric layer 4. In the acoustic wave device 1 according to Preferred Embodiment 1, the silicon oxide film 7 overlaps the entire or substantially the entire first main surface 21 of the silicon substrate 2 in the thickness direction D1 of the piezoelectric layer 4. In the acoustic wave device 1 according to Preferred Embodiment 1, since the entire or substantially the entire first main surface 21 is the rough surface 211, the silicon oxide film 7 overlaps the rough surface 211 of the silicon substrate 2 in a plan view from the thickness direction D1 of the piezoelectric layer 4. In the acoustic wave device 1 according to Preferred Embodiment 1, the silicon substrate 2 and the piezoelectric layer 4 are bonded to each other with the silicon oxide film 7 interposed therebetween.

A thickness of the silicon oxide film 7 is, for example, equal to or more than about 0.1 μm and equal to or less than about 10 μm.

(1.2.3) Piezoelectric Layer

As illustrated in FIG. 2, the piezoelectric layer 4 includes a first main surface 41 and a second main surface 42 that are opposed to each other. The first main surface 41 and the second main surface 42 are opposed to each other in the thickness direction D1 of the piezoelectric layer 4. The piezoelectric layer 4 is provided on the first main surface 21 of the silicon substrate 2. Here, the piezoelectric layer 4 overlaps the first main surface 21 of the silicon substrate 2 and the cavity 26 in a plan view from the thickness direction D1. In the piezoelectric layer 4, the second main surface 42 among the first main surface 41 and the second main surface 42 is positioned on the silicon substrate 2 side. The first main surface 41 of the piezoelectric layer 4 is a main surface of the piezoelectric layer 4 on a side opposite to the silicon substrate 2 side. The second main surface 42 of the piezoelectric layer 4 is a main surface of the piezoelectric layer 4 on the silicon substrate 2 side.

In the acoustic wave device 1, a distance between the first main surface 41 of the piezoelectric layer 4 and the silicon substrate 2 is longer than a distance between the second main surface 42 of the piezoelectric layer 4 and the silicon substrate 2. A material of the piezoelectric layer 4 is, for example, lithium niobate ($LiNbO_3$) or lithium tantalate ($LiTaO_3$). The piezoelectric layer 4 is, for example, Z-cut $LiNbO_3$ or Z-cut $LiTaO_3$. With regard to Euler angles ($\varphi$, $\theta$, $\psi$) of the piezoelectric layer 4, $\varphi$ is about 0°±10° and $\theta$ is about 0°±10°, for example. $\psi$ is any angle. From the viewpoint of increasing the coupling coefficient, the piezoelectric layer 4 is preferably Z-cut $LiNbO_3$ or Z-cut $LiTaO_3$. The piezoelectric layer 4 may be, for example, rotated Y-cut $LiNbO_3$, rotated Y-cut $LiTaO_3$, X-cut $LiNbO_3$, or X-cut $LiTaO_3$. The propagation orientation may be a Y-axis direction, or an X-axis direction of crystallographic axes (X, Y, Z) defined for a crystal structure of the piezoelectric layer 4, or may be, for example, a direction rotated within a range of about ±90° from the X-axis. The piezoelectric layer 4 is single crystal, but is not limited thereto. For example, the piezoelectric layer 4 may be a twin crystal or may be made of ceramics.

The thickness of the piezoelectric layer 4 is, for example, equal to or more than about 50 nm and equal to or less than about 1000 nm and is about 400 nm as an example.

The piezoelectric layer 4 includes the specified region 45. The specified region 45 is a region of the piezoelectric layer 4 that intersects with both the first electrode 51 and the second electrode 52 in a direction in which the first electrode 51 and the second electrode 52 face each other and that is positioned between the first electrode 51 and the second electrode 52 in a plan view from the thickness direction D1 of the piezoelectric layer 4.

(1.2.4) Electrodes

The plurality of first electrodes 51 and the plurality of second electrodes 52 are provided on the first main surface 41 of the piezoelectric layer 4.

In the acoustic wave device 1, the first electrode 51 and the second electrode 52 define a pair with different potentials from each other. In the acoustic wave device 1, one of the pair of the first electrode 51 and the second electrode 52 is an electrode having a potential at a non-ground (signal) side when an AC voltage is applied, and the other is an electrode having a ground potential.

In the acoustic wave device 1, the plurality of first electrodes 51 and the plurality of second electrodes 52 are alternately provided one by one so as to be separated from each other. Thus, the first electrode 51 and the second electrode 52 that are adjacent to each other are separated from each other. A distance between center lines of a pair of the first electrode 51 and the second electrode 52 is, for example, equal to or more than about 1 μm and equal to or less than about 10 μm, and is about 3 μm as an example. A group of electrodes including the plurality of first electrodes 51 and the plurality of second electrodes 52 preferably has a configuration in which the plurality of first electrodes 51 and the plurality of second electrodes 52 are separated from each other in the second direction D2, and may have a configuration in which the plurality of first electrodes 51 and the plurality of second electrodes 52 are not alternately provided so as to be separated from each other. For example, a region in which the first electrodes 51 and the second electrodes 52 are provided one by one so as to be separated from each other and a region in which two first electrodes 51 or two second electrodes 52 are provided side by side in the second direction D2 may be mixed.

The plurality of first electrodes 51 and the plurality of second electrodes 52 have an elongated shape (linear shape), as illustrated in FIG. 1, in a third direction D3 orthogonal or substantially orthogonal to the second direction D2 defining and functioning as a longitudinal direction and to the second direction D2 defining and functioning as a width direction in a plan view from the thickness direction D1 of the piezoelectric layer 4. A length of each of the plurality of first electrodes 51 is, for example, about 20 μm, but is not limited thereto. A width H1 (first electrode width H1) of each of the plurality of first electrodes 51 is, for example, equal to or more than about 50 nm and equal to or less than about 1000 nm, and is about 500 nm as an example. A length of each of the plurality of second electrodes 52 is, for example, about 20 μm, but is not limited thereto. A width H2 (second electrode width H2) of each of the plurality of second electrodes 52 is, for example, equal to or more than about 50 nm and equal to or less than about 1000 nm, and is about 500 nm as an example.

Each of the plurality of first electrodes 51 includes a first electrode main portion 510. The first electrode main portion 510 is a portion of the first electrode 51 that intersects with the second electrode 52 in the direction in which the first electrode 51 and the second electrode 52 face each other. Additionally, each of the plurality of second electrodes 52 includes a second electrode main portion 520. The second electrode main portion 520 is a portion of the second electrode 52 that intersects with the first electrode 51 in the direction in which the first electrode 51 and the second electrode 52 face each other.

In the acoustic wave device 1 according to Preferred Embodiment 1, the first electrode width H1 of each of the plurality of first electrodes 51 is the same or substantially the same, but is not limited thereto, and may be different from each other. Also, in the acoustic wave device 1 according to Preferred Embodiment 1, the second electrode width H2 of each of the plurality of second electrodes 52 is the same or substantially the same, but is not limited thereto, and may be different from each other. In the acoustic wave device 1 according to Preferred Embodiment 1, the first electrode width H1 and the second electrode width H2 are the same or substantially the same, but are not limited thereto, and the first electrode width H1 and the second electrode width H2 may be different from each other.

Regarding the acoustic wave device 1 according to Preferred Embodiment 1, although each of the number of the first electrodes 51 and the number of the second electrodes 52 is, for example, five in FIG. 1, each of the number of the first electrodes 51 and the number of the second electrodes 52 is not limited to five, and may be one, may be from two to four, may be six or more, or may be 50 or more, for example.

The second direction D2 in which the first electrode 51 and second electrode 52 that are adjacent to each other and face each other is preferably orthogonal or substantially orthogonal to the polarization direction PZ1 (see FIG. 2) of the piezoelectric layer 4, but is not limited to this configuration. For example, when the piezoelectric layer 4 is not a Z-cut piezoelectric body, the first electrode 51 and the second electrode 52 may face each other in a direction orthogonal or substantially orthogonal to the third direction D3 defining and functioning as the longitudinal direction. The first electrode 51 and the second electrode 52 may not be rectangular or substantially rectangular. In this case, the third direction D3 defining and functioning as the longitudinal direction may be a long side direction of a circumscribed polygon circumscribed to the first electrode 51 and the second electrode 52 in a plan view of the first electrode 51 and the second electrode 52. When the first wiring portion 61 is connected to the first electrode 51 and the second wiring portion 62 is connected to the second electrode 52, the "circumscribed polygon circumscribed to the first electrode 51 and the second electrode 52" includes a polygon circumscribed to at least a portion of the first electrode 51 excluding a portion connected to the first wiring portion 61 and a portion of the second electrode 52 excluding a portion connected to the second wiring portion 62.

As illustrated in FIG. 2, each of the plurality of first electrodes 51 includes a first main surface 511 and a second main surface 512 that intersect with the thickness direction D1 of the piezoelectric layer 4, and two side surfaces 513 and 513 that intersect with the width direction of the first electrode 51. In each of the plurality of first electrodes 51, the second main surface 512 among the first main surface 511 and the second main surface 512 is positioned on the first main surface 41 side of the piezoelectric layer 4 and is in planar contact with the first main surface 41 of the piezoelectric layer 4.

Each of the plurality of second electrodes 52 includes a first main surface 521 and a second main surface 522 that intersect with the thickness direction D1 of the piezoelectric layer 4, and two side surfaces 523 and 523 that intersect with the width direction of the second electrode 52. In each of the plurality of second electrodes 52, the second main surface 522 among the first main surface 521 and the second main surface 522 is positioned on the first main surface 41 side of the piezoelectric layer 4 and is in planar contact with the first main surface 41 of the piezoelectric layer 4.

The plurality of first electrodes 51 and the plurality of second electrodes 52 have electrical conductivity. A material of each first electrode 51 and a material of each second electrode 52 are, for example, aluminum (Al), copper (Cu), platinum (Pt), gold (Au), silver (Ag), titanium (Ti), nickel (Ni), chromium (Cr), molybdenum (Mo), tungsten (W), or an alloy including any of these metals as a main component. Further, each first electrode 51 and each second electrode 52 may have a structure in which a plurality of metal films made of these metals or the alloy are laminated. Each first electrode 51 and each second electrode 52 include, for example, a laminated film of an adhesion film made of a Ti film and a main electrode film made of an Al film or an AlCu film on the adhesion film. The adhesion film has a thickness of, for example, about 10 nm. Additionally, the main electrode film has a thickness of, for example, about 80 nm. In the AlCu film, a concentration of Cu is preferably, for example, equal to or more than about 1 wt % and equal to or less than about 20 wt %.

(1.2.5) First Wiring Portion and Second Wiring Portion

The first wiring portion 61 includes a first busbar 611. The first busbar 611 is a conductor to cause the plurality of first electrodes 51 to have the same or substantially the same potential. The first busbar 611 has an elongated shape (linear shape) whose longitudinal direction is in the second direction D2. The first busbar 611 is connected to the plurality of first electrodes 51. The plurality of first electrodes 51 connected to the first busbar 611 extend toward a second busbar 621. In the acoustic wave device 1, a first conductor including the plurality of first electrodes 51 and the first busbar 611 has a comb shape in a plan view from the thickness direction D1 of the piezoelectric layer 4. The first busbar 611 is integrally provided with the plurality of first electrodes 51, but is not limited to this.

The second wiring portion 62 includes the second busbar 621. The second busbar 621 is a conductor to cause the plurality of second electrodes 52 to have the same or substantially the same potential. The second busbar 621 has an elongated shape (linear shape) whose longitudinal direction is in the second direction D2. The second busbar 621 is connected to the plurality of second electrodes 52. The plurality of second electrodes 52 connected to the second busbar 621 extend toward the first busbar 611. In the acoustic wave device 1, a second conductor including the plurality of second electrodes 52 and the second busbar 621 has a comb shape in a plan view from the thickness direction D1 of the piezoelectric layer 4. The second busbar 621 is integrally provided with the plurality of second electrodes 52, but is not limited to this.

The first busbar 611 and the second busbar 621 face each other in the third direction D3.

The first wiring portion 61 and the second wiring portion 62 have electrical conductivity. A material of the first wiring portion 61 and a material of the second wiring portion 62 are, for example, Al, Cu, Pt, Au, Ag, Ti, Ni, Cr, Mo, W, or an alloy including any of these metals as a main component. Further, the first wiring portion 61 and the second wiring portion 62 may have a structure including a plurality of metal films made of these metals or the alloy that are laminated. The first wiring portion and the second wiring portion 62 include, for example, a laminated film including an adhesion film made of a Ti film and a main wiring film made of an Al film or an AlCu film on the adhesion film. The adhesion film has a thickness of, for example, about 10 nm. In addition, the main wiring film has a thickness of, for example, about 80 nm. In the AlCu film, a concentration of Cu is preferably, for example, equal to or more than about 1 wt % and equal to or less than about 20 wt %.

In the acoustic wave device 1, each of the first busbar 611 and the second busbar 621 may include a metal film on the main wiring film from the viewpoint of reducing the resistance of the first busbar 611 and the second busbar 621. Further, the thickness of each of the first wiring portion 61 and the second wiring portion 62 may be larger than the thicknesses of the first electrode 51 and the second electrode 52.

(1.2.6) Trap Region

The trap region 10 is provided on the second main surface side of the piezoelectric layer 4. The trap region 10 is provided in the silicon substrate 2. The trap region 10 reduces or prevents movement of charges along the first main surface 21 of the silicon substrate 2. Here, in the acoustic wave device 1 according to Preferred Embodiment 1, when there is a potential difference between the first wiring portion 61 and the second wiring portion 62, the trap region 10 reduces or prevents the charges near an interface between the first main surface 21 of the silicon substrate 2 and the silicon oxide film 7 to move between the first wiring portion 61 and the second wiring portion 62 along the first main surface 21 of the silicon substrate 2.

In the acoustic wave device 1 according to Preferred Embodiment 1, a trap density of the surface region 2S included in the trap region 10 is higher than a trap density of the bulk region 2B. Here, the trap density is a density of traps that trap charges (free charge carriers). Additionally, in the trap region 10, a carrier mobility in the surface region 2S is lower than a carrier mobility in the bulk region 2B. In the acoustic wave device 1 according to Preferred Embodiment 1, the cavity 26 included in the silicon substrate 2 overlaps a portion of each of the first wiring portion 61 and the second wiring portion 62 in a plan view from the thickness direction D1 of the piezoelectric layer 4, and is included in the trap region 10. That is, in the acoustic wave device 1 according to Preferred Embodiment 1, the trap region 10 includes the surface region 2S of the silicon substrate 2 and the cavity 26 of the silicon substrate 2.

(1.3) Method of Manufacturing Acoustic Wave Device

In a non-limiting example of a method of manufacturing the acoustic wave device 1, for example, after a single-crystal silicon substrate including a first main surface and a second main surface that are opposed to each other is prepared, first to sixth processes are performed. In the first process, the silicon substrate 2 including the surface region 2S and the bulk region 2B is formed by roughening the first main surface of the single-crystal silicon substrate. In the second process, the silicon oxide film 7 is formed on the first main surface 21 of the silicon substrate 2. In the third process, a piezoelectric substrate of which the piezoelectric layer 4 is formed and the silicon substrate 2 are bonded to each other with the silicon oxide film 7 interposed therebetween. In the fourth process, the piezoelectric layer 4 made of a portion of the piezoelectric substrate is formed by thinning the piezoelectric substrate. In the fifth process, the plurality of first electrodes 51, the plurality of second electrodes 52, the first wiring portion 61, the second wiring portion 62, the first terminal T1, and the second terminal T2 are formed on the first main surface 41 of the piezoelectric layer 4. In the sixth process, the cavity 26 is formed from the second main surface 22 of the silicon substrate 2. In the above-described fifth process, the plurality of first electrodes 51, the plurality of second electrodes 52, the first wiring portion 61, the second wiring portion 62, the first terminal T1, and the second terminal T2 are formed by, for example, a photolithography technique, an etching technique, a thin film formation technique, or the like. Further, in the above-described sixth process, a region of the silicon substrate 2 in which the cavity 26 is to be formed is etched by, for example, a photolithography technique, an etching technique, or the like. In the sixth process, the silicon substrate 2 is etched by, for example, the silicon oxide film 7 as an etching stopper layer, and then, an unnecessary portion of the silicon oxide film 7 is removed by performing etching to expose a portion of the second main surface 42 of the piezoelectric layer 4. Furthermore, in preparing the single-crystal silicon substrate, a single-crystal silicon wafer is prepared, and in the third process, a piezoelectric wafer is used as the piezoelectric substrate. In the method of manufacturing the acoustic wave device 1, a wafer including a plurality of acoustic wave devices 1 is cut with, for example, a dicing machine to obtain the plurality of acoustic wave devices 1 (chips).

The method of manufacturing the acoustic wave device 1 described above is a non-limiting example and is not particularly limited thereto. For example, the piezoelectric layer 4 may be formed by a film formation technique. In this case, the method of manufacturing the acoustic wave device 1 includes a process of forming the piezoelectric layer 4 instead of the third process and the fourth process. The piezoelectric layer 4 formed as a film by the film formation technique may be, for example, a single crystal or a twin crystal. Examples of the film formation technique include a chemical vapor deposition (CVD) method, but the film formation technique is not limited thereto.

(1.4) Operation and Characteristics of Acoustic Wave Device

The acoustic wave device 1 according to Preferred Embodiment 1 uses a bulk wave of the thickness-shear primary mode. As described above, the bulk wave of the thickness-shear primary mode is a bulk wave whose propagation direction is the thickness direction D1 of the piezoelectric layer 4 due to thickness-shear vibration of the piezoelectric layer 4 and whose number of nodes in the thickness direction D1 of the piezoelectric layer 4 is one. The thickness-shear vibration is excited by the first electrode 51 and the second electrode 52. The thickness-shear vibration is excited in the specified region 45 between the first electrode 51 and the second electrode 52 that are adjacent to each other in a plan view from the thickness direction D1 in the piezoelectric layer 4. The thickness-shear vibration can be checked by using, for example, a finite element method (FEM). More specifically, the thickness-shear vibration can be checked by, for example, analyzing a strain by analyzing a displacement distribution by FEM by using parameters of the piezoelectric layer 4 (the material, the Euler angles, the thickness, and the like), parameters of the first electrode 51 and the second electrode 52 (the materials, the thicknesses, the distance between the center lines of the first electrode 51 and the second electrode 52, and the like), and the like. The Euler angles of the piezoelectric layer 4 can be obtained by analysis.

Here, a difference between a Lamb wave used in the conventional acoustic wave device and the bulk wave of the thickness-shear primary mode will be described with reference to FIGS. 6A and 6B.

Figure 6A:
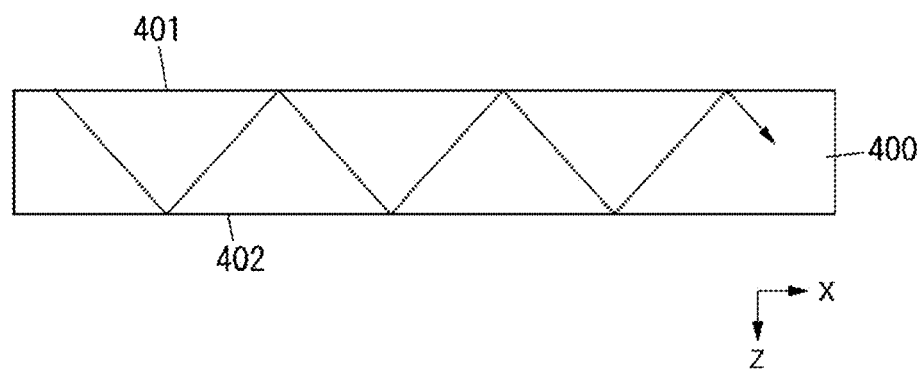
FIG. 6A is an explanatory diagram of a Lamb wave.

FIG. 6A is a schematic front cross-sectional view for explaining a Lamb wave propagating in a piezoelectric thin film of a conventional acoustic wave device such as the surface acoustic wave device described in International Publication No. 2015/098678. In the conventional acoustic wave device, an acoustic wave propagates in a piezoelectric thin film 400 as indicated by an arrow. Here, the piezoelectric thin film 400 includes a first main surface 401 and a second main surface 402 that are opposed to each other. In FIG. 6A, a Z direction and an X direction are illustrated separately from the piezoelectric thin film 400. In FIG. 6A, the Z direction is a thickness direction connecting the first main surface 401 and the second main surface 402 of the piezoelectric thin film 400. The X direction is a direction in which a plurality of electrode fingers of an IDT electrode are disposed. The Lamb wave is a plate wave in which an acoustic wave propagates in the X direction as illustrated in FIG. 6A. Thus, in the conventional acoustic wave device, since an acoustic wave propagates in the X direction, two reflectors are disposed one by one at both sides of the IDT electrode to obtain desired resonance characteristics. Thus, in the conventional acoustic wave device, since a propagation loss of an acoustic wave occurs, when the size is reduced, that is, when the number of pairs of electrode fingers is reduced, a Q value decreases.

Figure 6B:
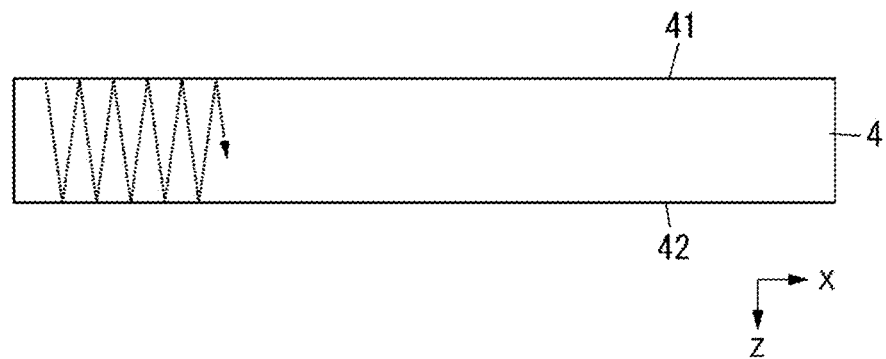
FIG. 6B is an explanatory diagram of a bulk wave of a thickness-shear primary mode.

On the other hand, in the acoustic wave device 1 according to Preferred Embodiment 1, since vibration displacement is generated in a thickness-shear direction, an acoustic wave substantially propagates in a direction connecting the first main surface 41 and the second main surface 42 of the piezoelectric layer 4, that is, in the Z direction, and resonates, as illustrated in FIG. 6B. That is, a component in the X direction of the acoustic wave is significantly smaller than a component in the Z direction. In the acoustic wave device 1 according to Preferred Embodiment 1, since resonance characteristics are obtained by propagation of the acoustic wave in the Z direction, a reflector is not necessarily required. Thus, in the acoustic wave device 1 according to Preferred Embodiment 1, no propagation loss occurs when the acoustic wave propagates into the reflector. Thus, in the acoustic wave device 1 according to Preferred Embodiment 1, even when the number of pairs of electrodes, each pair of which includes the first electrode 51 and the second electrode 52, is reduced in order to reduce the size of the acoustic wave device 1, a decrease in the Q value is unlikely to occur.

Figure 7:
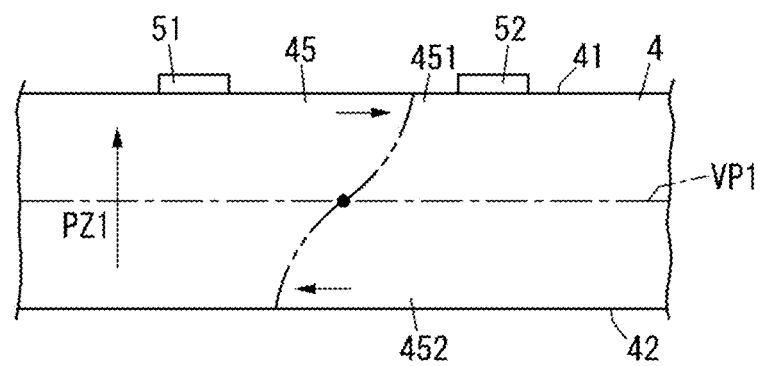
FIG. 7 is an explanatory diagram of an operation of the acoustic wave device according to Preferred Embodiment 1 of the present invention.
Figure 8:
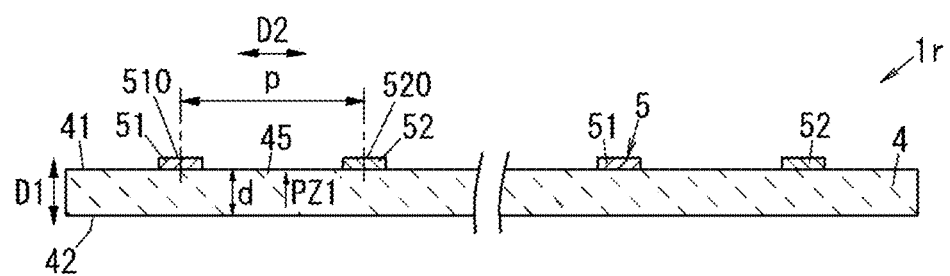
FIG. 8 is an explanatory diagram of a structural model of an acoustic wave device according to a reference preferred embodiment of the present invention.

In the acoustic wave device 1 according to Preferred Embodiment 1, as illustrated in FIG. 7, a bulk wave of the thickness-shear primary mode has opposite amplitude directions in a first region 451 included in the specified region 45 of the piezoelectric layer 4 and a second region 452 included in the specified region 45. In FIG. 7, a two-dot chain line schematically indicates a bulk wave when a voltage is applied between the first electrode 51 and the second electrode 52 such that the second electrode 52 has a higher potential than that of the first electrode 51. The first region 451 is a region of the specified region 45 between the first main surface 41 and a virtual plane VP1 that is orthogonal or substantially orthogonal to the thickness direction D1 of the piezoelectric layer 4 and that divides the piezoelectric layer 4 into two. The second region 452 is a region of the specified region 45 between the virtual plane VP1 and the second main surface 42.

Characteristics for a structural model 1r (see FIG. 8) of an acoustic wave device according to a reference preferred embodiment of the present invention that uses a bulk wave of the thickness-shear primary mode were simulated. Regarding the structural model 1r, elements the same as or similar to those of the acoustic wave device 1 according to Preferred Embodiment 1 are denoted by the same reference characters, and description thereof will be omitted.

The structural model 1r differs from the acoustic wave device 1 according to Preferred Embodiment 1 in that the first wiring portion 61, the second wiring portion 62, and the trap region 10 are not included. In the simulation, the number of pairs of the first electrode 51 and the second electrode 52 was made infinite, and the piezoelectric layer 4 was made of 120° rotated Y-cut X-propagation LiNbO$_3$.

In the structural model 1r, the piezoelectric layer 4 is a membrane, and the second main surface 42 of the piezoelectric layer 4 is in contact with air. In the structural model 1r, in any cross section (FIG. 8) along the thickness direction D1 of the piezoelectric layer 4, a distance between center lines of the first electrode 51 and the second electrode 52 that are adjacent to each other is represented by p, and a thickness of the piezoelectric layer 4 is represented by d. Further, in the structural model 1r, in a plan view from the thickness direction D1 of the piezoelectric layer 4, an area of the first electrode main portion 510 is represented by S1, an area of the second electrode main portion 520 is represented by S2, an area of the specified region 45 is represented by S0, and a structural parameter defined by (S1+S2)/(S1+S2+S0) is represented by MR. When a plurality of at least either the first electrodes 51 or the second electrodes 52 are provided on the piezoelectric layer 4, the above-described distance p between the center lines indicates each distance between the center lines of any pair of the first electrode 51 and the second electrode 52 that are adjacent to each other, among the plurality of at least either the first electrodes 51 or the second electrodes 52.

Figure 9A:
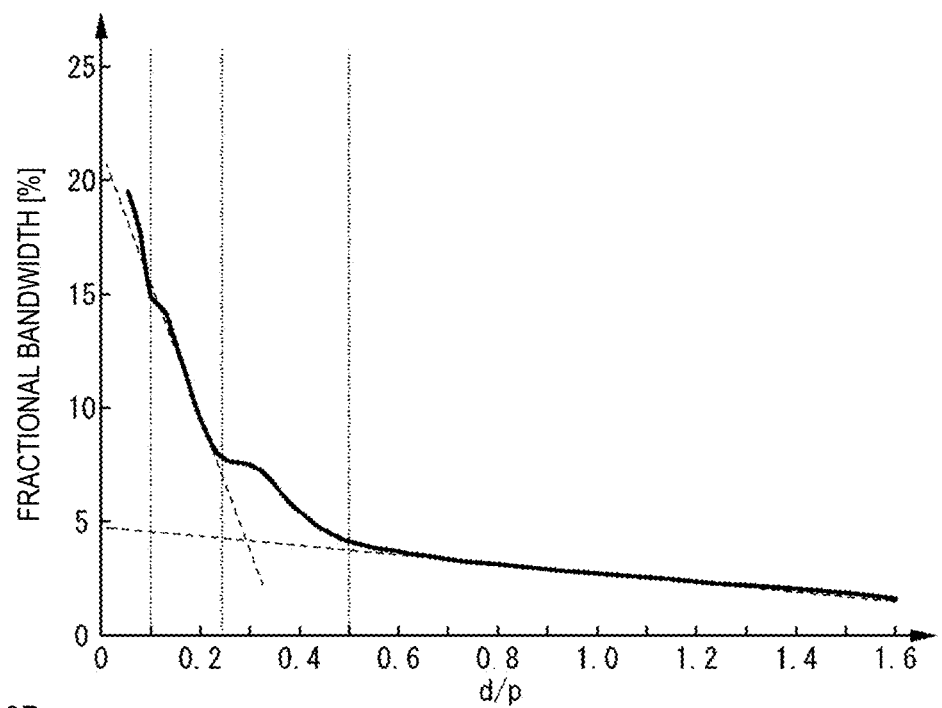
FIG. 9A is a graph showing a relationship between a fractional bandwidth of a thickness-shear mode and [a thickness of a piezoelectric layer]/[a distance between center lines of two electrodes forming a pair] for the structural model.
Figure 9B:
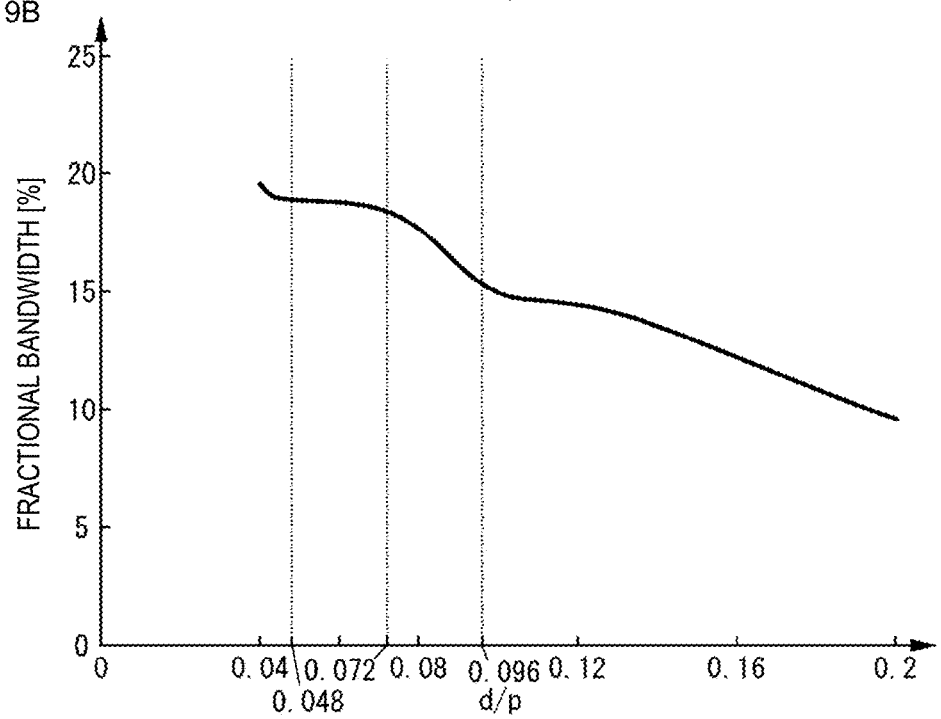
FIG. 9B is a graph showing the relationship between the fractional bandwidth of the thickness-shear mode and [the thickness of the piezoelectric layer]/[the distance between the center lines of the two electrodes forming the pair] for the structural model, and is a graph obtained by enlarging a range from about 0 to about 0.2 on a horizontal axis of FIG. 9A.

FIGS. 9A and 9B are graphs showing a relationship between a fractional bandwidth and d/p when different potentials are applied to the first electrode 51 and the second electrode 52 for the structural model 1r. In FIGS. 9A and 9B, the horizontal axis represents d/p and the vertical axis represents the fractional bandwidth. FIGS. 9A and 9B indicate a case where the piezoelectric layer 4 is made of 120° rotated Y-cut X-propagation LiNbO$_3$, but similar tendencies are seen in the cases of other cut angles. Further, with the structural model 1r of the acoustic wave device, even when the material of the piezoelectric layer 4 is LiTaO$_3$, the relationship between the fractional bandwidth and d/p has tendencies the same as or similar to those in FIGS. 9A and 9B. Furthermore, with the structural model 1r of the acoustic wave device, the relationship between the fractional bandwidth and d/p has tendencies the same as or similar to those in the FIGS. 9A and 9B regardless of the number of pairs of the first electrode 51 and the second electrode 52. In addition, with the structural model 1r of the acoustic wave device, not only when the second main surface 42 of the piezoelectric layer 4 is in contact with air but also when the second main surface 42 is in contact with an acoustic reflection layer, the relationship between the fractional bandwidth and d/p has tendencies the same as or similar to those in FIGS. 9A and 9B.

It can be seen from FIG. 9A that, with the structural model 1r of the acoustic wave device, a value of the fractional bandwidth drastically changes with d/p=about 0.5 being as an inflection point. With the structural model 1r of the acoustic wave device, when a relationship of d/p> about 0.5 is satisfied, a coupling coefficient is low and the fractional bandwidth is less than about 5% regardless of how much d/p is changed within the range of about 0.5<d/p< about 1.6. On the other hand, with the structural model 1r of the acoustic wave device, when a relationship of d/p about 0.5 is satisfied, it is possible to increase the coupling coefficient and set the fractional bandwidth to be equal to or more than about 5% by changing d/p within the range of about 0<d/p≤ about 0.5.

In addition, with the structural model 1r of the acoustic wave device, when a relationship of d/p≤ about 0.24 is satisfied, by changing d/p within the range of about 0<d/p≤ about 0.24, the coupling coefficient can be further increased and the fractional bandwidth can be further increased. Also with the acoustic wave device 1 according to Preferred Embodiment 1, as illustrated in FIG. 2, in any cross section along the thickness direction D1 of the piezoelectric layer 4, when the distance between the center lines of the first electrode 51 and the second electrode 52 is represented by p and the thickness of the piezoelectric layer 4 is represented by d, the relationship between the fractional bandwidth and d/p has a tendency the same as or similar to that of the relationship between the fractional bandwidth and d/p of the structural model 1r of the acoustic wave device.

Furthermore, as is clear from FIG. 9A, when a relationship of d/p≤ about 0.10 is satisfied, by changing d/p within the range of about 0<d/p≤ about 0.10, it is possible to further increase the coupling coefficient and further increase the fractional bandwidth.

FIG. 9B is a graph obtained by enlarging a part of FIG. 9A. As shown in FIG. 9B, since the fractional bandwidth changes with d/p=0.096 being as an inflection point, when a relation of d/p≤0.096 is satisfied, by changing d/p within the range of 0<d/p≤0.096, it is possible to further increase the coupling coefficient and further increase the fractional bandwidth as compared with the case where a relation of 0.096<d/p is satisfied. Further, as shown in FIG. 9B, the fractional bandwidth changes with d/p=about 0.072 and d/p=about 0.048 being as inflection points, and when a relationship of about 0.048≤d/p≤ about 0.072 is satisfied, it is possible to reduce or prevent a change in the coupling coefficient due to a change in d/p and to set the fractional bandwidth to a constant or substantially constant value.

Figure 10:
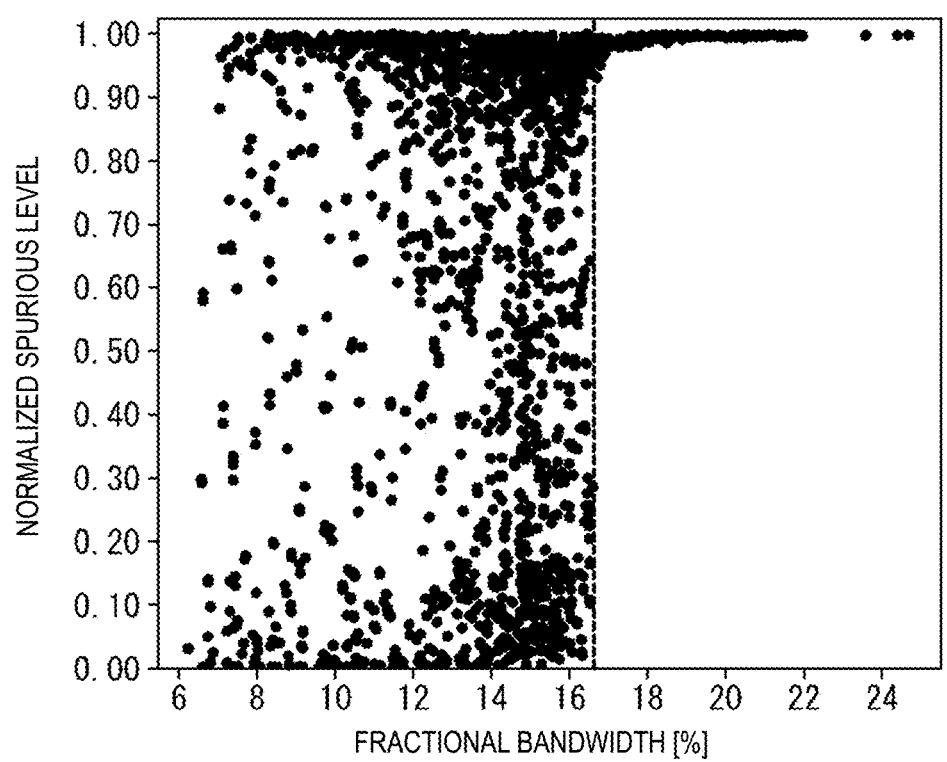
FIG. 10 is a graph showing a relationship between the fractional bandwidth of the thickness-shear mode and a normalized spurious level for the structural model.

FIG. 10 is a graph plotting a spurious level in a frequency band between a resonant frequency and an anti-resonant frequency when the thickness d of the piezoelectric layer 4, the distance p between the center lines of the first electrode 51 and the second electrode 52, the first electrode width H1, and the second electrode width H2 are changed in the structural model 1r of the acoustic wave device according to the reference preferred embodiment using the thickness-shear mode. In FIG. 10, the horizontal axis represents the fractional bandwidth and the vertical axis represents a normalized spurious level. The normalized spurious level is a value obtained by normalizing a spurious level with a spurious level of a fractional bandwidth (for example, about 22%) in which the spurious level has the same or substantially the same value as 1 even when the thickness d of the piezoelectric layer 4, the distance p between the center lines of the first electrode 51 and the second electrode 52, the first electrode width H1, and the second electrode width H2 are changed. FIG. 10 shows a case where Z-cut LiNbO₃ capable of more suitably exciting the thickness-shear mode is used for the piezoelectric layer 4, but the same or similar tendencies are observed in the cases of other cut angles. Additionally, with the structural model 1r of the acoustic wave device, when the material of the piezoelectric layer 4 is made of LiTaO₃, the relationship between the normalized spurious level and the fractional bandwidth has a tendency the same as or similar to that shown in FIG. 10. Further, with the structural model 1r of the acoustic wave device, the relationship between the normalized spurious level and the fractional bandwidth has a tendency the same as or similar to that in FIG. 10 regardless of the number of pairs of the first electrode 51 and the second electrode 52. Furthermore, with the structural model 1r of the acoustic wave device, the relationship between the normalized spurious level and the fractional bandwidth has a tendency the same as or similar to that in FIG. 10 not only when the second main surface 42 of the piezoelectric layer 4 is in contact with air but also when the second main surface 42 is in contact with the acoustic reflection layer.

Figure 11:
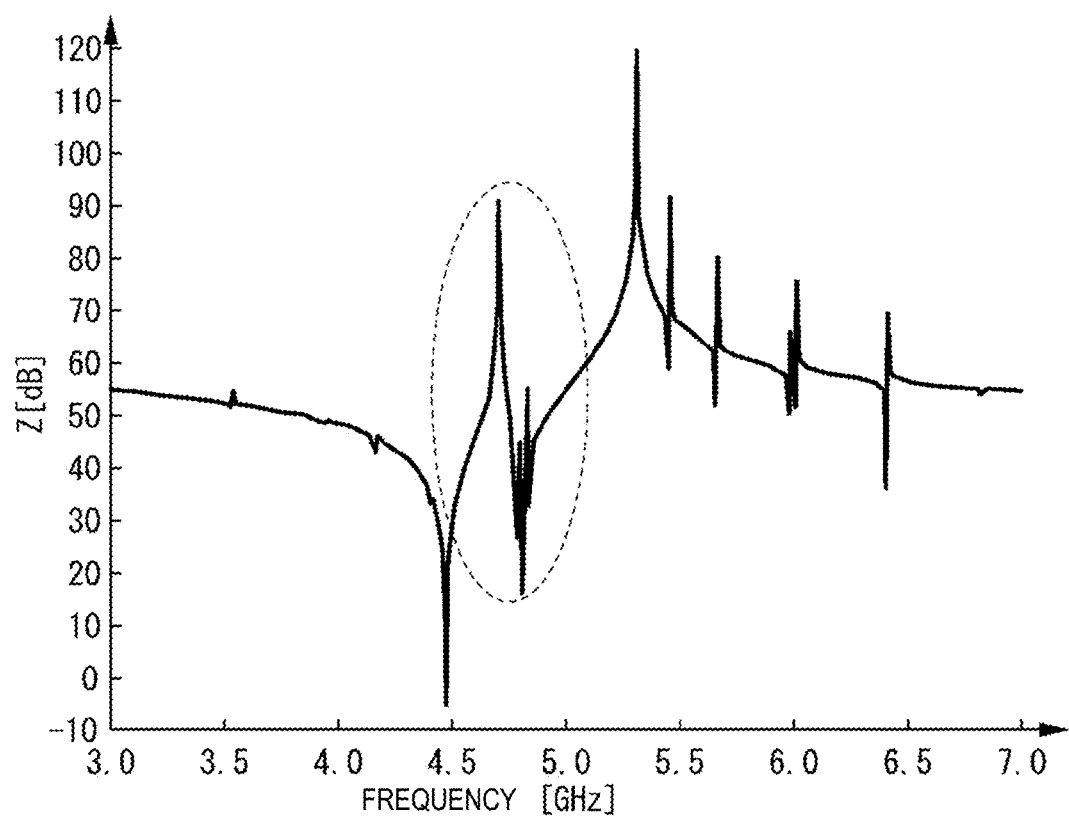
FIG. 11 is an impedance-frequency characteristic diagram of the structural model.

It can be seen from FIG. 10 that when the fractional bandwidth exceeds about 17%, the normalized spurious levels are aggregated to 1. This means that, when the fractional bandwidth is equal to or more than about 17%, some kind of sub-resonance exists in the band between the resonant frequency and the anti-resonant frequency as in frequency characteristics of impedance shown in FIG. 11 as an example. FIG. 11 shows the frequency characteristics of impedance when Z-cut LiNbO₃ having Euler angles (0°, 0°, 90°) is used as the piezoelectric layer 4, d/p=about 0.08, and MR=about 0.35. In FIG. 11, a portion indicating the sub-resonance is surrounded by a broken line.

As described above, when the fractional bandwidth exceeds about 17%, even when the thickness d of the piezoelectric layer 4, the first electrode width H1, and the second electrode width H2 are changed, a large spurious component is included in the band between the resonant frequency and the anti-resonant frequency. Such a spurious component is generated due to an overtone in a planar direction, mainly in a direction in which the first electrode 51 and the second electrode 52 face each other. Thus, from the viewpoint of reducing or preventing the spurious component in the band, the fractional bandwidth is preferably equal to or less than about 17%, for example. Since the acoustic wave device 1 according to Preferred Embodiment 1 also exhibits a tendency the same as or similar to that of the structural model 1r of the acoustic wave device with regard to the relationship between the normalized spurious level and the fractional bandwidth, the fractional bandwidth is preferably equal to or less than about 17%, for example.

Figure 12:
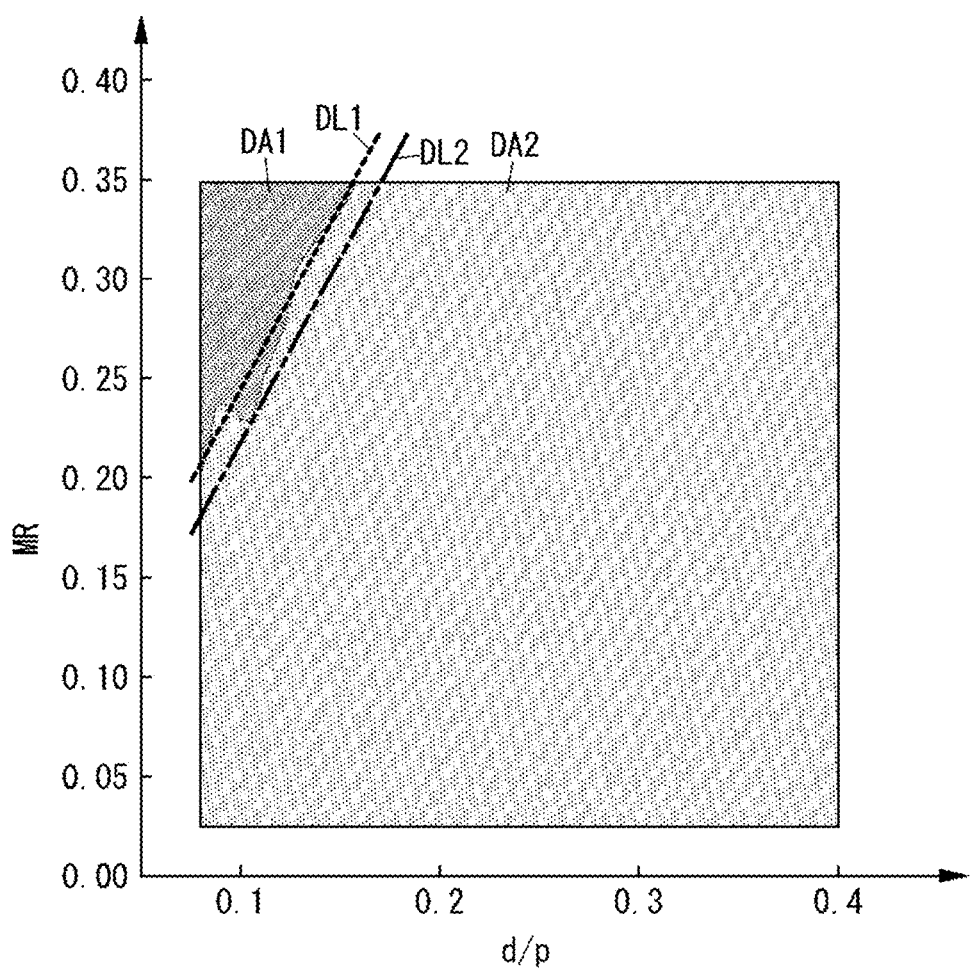
FIG. 12 is a diagram for explaining a fractional bandwidth distribution in a combination of [the thickness of the piezoelectric layer]/[the distance between the center lines of the two electrodes forming the pair] and a structural parameter for the structural model.

FIG. 12 shows, for the structural model 1r of the acoustic wave device, a first distribution region DA1 having a fractional bandwidth exceeding about 17% and a second distribution region DA2 having a fractional bandwidth being equal to or less than about 17% by using d/p and MR as parameters when Z-cut LiNbO₃ is used for the piezoelectric layer 4 and the thickness d of the piezoelectric layer 4, the distance p between the center lines of the first electrode 51 and the second electrode 52, the first electrode width H1, and the second electrode width H2 are changed. In FIG. 12, the first distribution region DA1 and the second distribution region DA2 have different dot densities, and the dot density of the first distribution region DA1 is higher than the dot density of the second distribution region DA2. Additionally, in FIG. 12, an approximately straight line DL1 of a boundary between the first distribution region DA1 and the second distribution region DA2 is indicated by a broken line. An approximately straight line DL1 is expressed by an equation of MR=1.75×(d/p)+0.075. Thus, in the structural model 1r of the acoustic wave device, the fractional bandwidth is likely to be equal to or less than about 17% by satisfying the condition of MR≤1.75×(d/p)+0.075. FIG. 12 shows a case where Z-cut LiNbO₃ capable of more suitably exciting the thickness-shear mode is used for the piezoelectric layer 4, but the same or similar tendencies are observed in the cases of other cut angles. Additionally, with the structural model 1r of the acoustic wave device, the approximately straight line DL1 is the same or substantially the same even when the material of the piezoelectric layer 4 is LiTaO₃. Further, with the structural model 1r of the acoustic wave device, the approximately straight line DL1 is the same or substantially the same regardless of the number of pairs of the first electrode 51 and the second electrode 52. Furthermore, with the structural model 1r of the acoustic wave device, the approximately straight line DL1 is the same or substantially the same not only when the second main surface 42 of the piezoelectric layer 4 is in contact with air but also when the second main surface 42 is in contact with the acoustic reflection layer. The acoustic wave device 1 according to Preferred Embodiment 1 satisfies the condition of MR≤1.75×(d/p)+0.075, as with the structural model 1r of the acoustic wave device, so that the fractional bandwidth is likely to be equal to or less than about 17%. In FIG. 12, an approximately straight line DL2 (hereinafter, also referred to as a second approximately straight line DL2) indicated by a dashed-dotted line separately from the approximately straight line DL1 (hereinafter, also referred to as the first approximately straight line DL1) is a line indicating a boundary for reliably setting the fractional bandwidth to being equal to or less than about 17%. The second approximately straight line DL2 is expressed by an equation of MR=1.75×(d/p)+0.05. Thus, with the acoustic wave device 1 according to Preferred Embodiment 1 and the structural model 1r of the acoustic wave device, the fractional bandwidth can be reliably set to be equal to or less than about 17% by satisfying the condition of MR≤1.75×(d/p)+0.05.

(1.5) Advantageous Effects

The acoustic wave device 1 according to Preferred Embodiment 1 includes the piezoelectric layer 4, and the first electrode 51 and the second electrode 52. The first electrode 51 and the second electrode 52 face each other in the direction D2 intersecting with the thickness direction D1 of the piezoelectric layer 4. The acoustic wave device 1 uses a bulk wave of the thickness-shear primary mode. The acoustic wave device 1 further includes the silicon substrate 2. The silicon substrate 2 includes the first main surface 21 and the second main surface 22 that are opposed to each other. The material of the piezoelectric layer 4 is lithium niobate or lithium tantalate. The piezoelectric layer 4 is provided on the first main surface 21 of the silicon substrate 2. The acoustic wave device 1 further includes the trap region 10 provided in the silicon substrate 2.

With the acoustic wave device 1 according to Preferred Embodiment 1 as described above, it is possible to handle higher frequencies and to improve linearity.

With the acoustic wave device 1 according to Preferred Embodiment 1, the resonant frequency is not limited by the distance between the center lines of the first electrode 51 and the second electrode 52 that are adjacent to each other, and the resonant frequency can be increased by reducing the thickness of the piezoelectric layer 4. Thus, the acoustic wave device 1 can handle higher frequencies without increasing the planar size of the acoustic wave device. Further, with the surface acoustic wave device described in International Publication No. 2015/098678, there is a case where a sufficient Q value cannot be obtained when the number of electrode fingers of the IDT electrode is reduced. On the other hand, with the acoustic wave device 1 according to Preferred Embodiment 1, since a sufficient Q value can be obtained even when the number of pairs of the first electrode 51 and the second electrode 52 is reduced, it is possible to obtain a sufficient Q value while achieving miniaturization. Further, in the acoustic wave device 1 according to Preferred Embodiment 1, providing the trap region 10 can improve linearity.

With the acoustic wave device 1 according to Preferred Embodiment 1, the trap region 10 reduces or prevents the movement of charges along the first main surface 21 of the silicon substrate as compared with an acoustic wave device according to a comparative example including an interface between a single-crystal silicon substrate and a silicon oxide film without including the trap region 10, and thus, the linearity can be improved.

Further, the acoustic wave device 1 according to Preferred Embodiment 1 includes the piezoelectric layer 4, and the first electrode 51 and the second electrode 52. The first electrode 51 and the second electrode 52 face each other in the direction D2 intersecting with the thickness direction D1 of the piezoelectric layer 4. In the acoustic wave device 1, in any cross section along the thickness direction D1 of the piezoelectric layer 4, d/p is equal to or less than about 0.5, when p represents the distance between the center lines of the first electrode 51 and the second electrode 52 that are adjacent to each other, and d represents the thickness of the piezoelectric layer 4. The acoustic wave device 1 further includes the silicon substrate 2. The silicon substrate 2 includes the first main surface 21 and the second main surface 22 that are opposed to each other. The material of the piezoelectric layer 4 is lithium niobate or lithium tantalate. The piezoelectric layer 4 is provided on the first main surface 21 of the silicon substrate 2. The acoustic wave device 1 further includes the trap region 10 provided in the silicon substrate 2.

With the acoustic wave device 1 according to Preferred Embodiment 1 as described above, it is possible to handle higher frequencies and to improve linearity.

Figure 13:
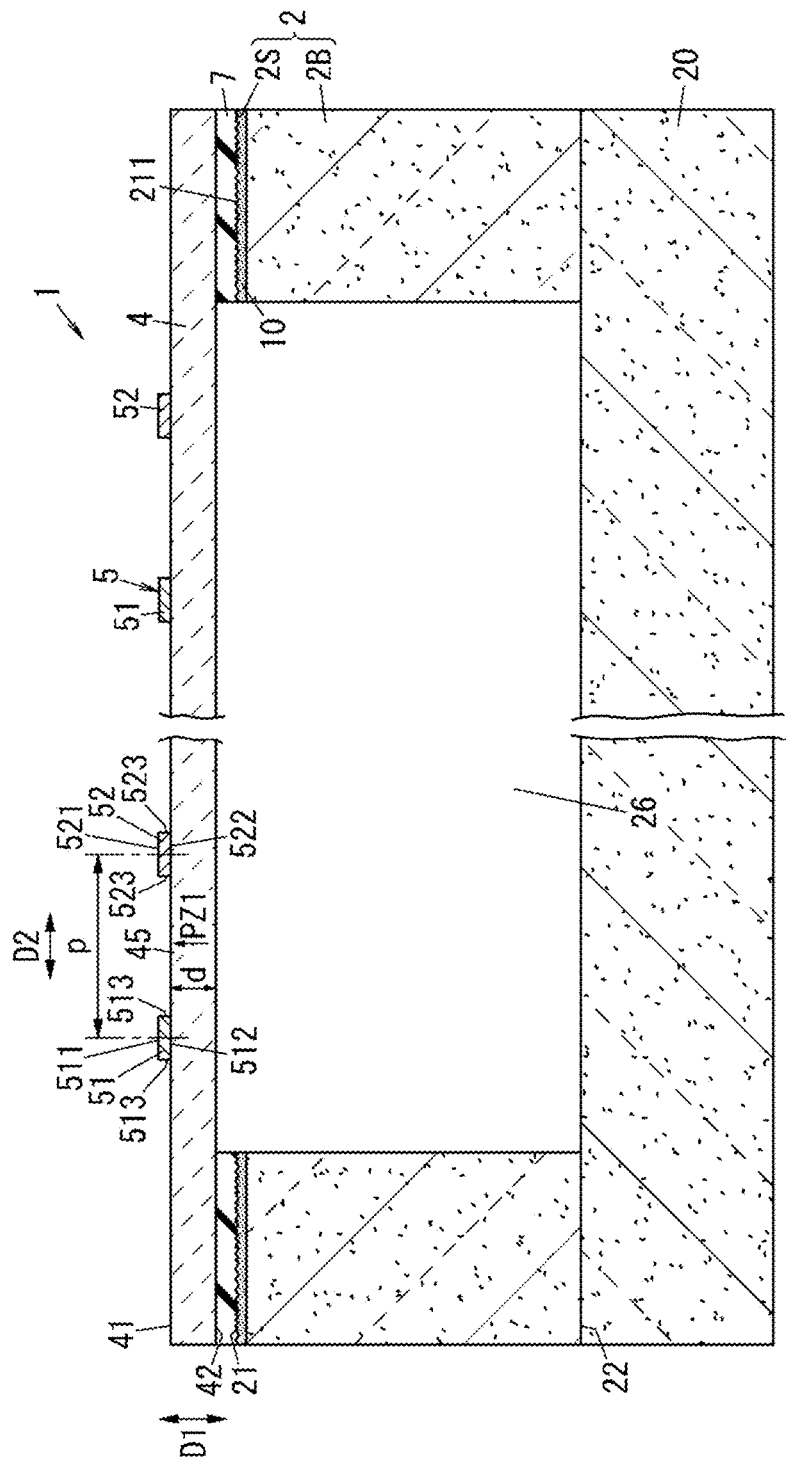
FIG. 13 is a cross-sectional view of another example of the acoustic wave device according to Preferred Embodiment 1 of the present invention.

Further, in the acoustic wave device 1 according to Preferred Embodiment 1, the silicon substrate 2 includes a portion of the cavity 26 that exposes a portion of the second main surface 42 of the piezoelectric layer 4. Note that the case where "the silicon substrate 2 includes a portion of the cavity 26" refers to a case where a portion of the cavity 26 is surrounded by the silicon substrate 2. "A case where a portion of the cavity 26 is surrounded by the silicon substrate 2" is not limited to, for example, a case where the cavity 26 is covered by the substrate 20 on the second main surface 22 side of the silicon substrate 2 as illustrated in FIG. 13 to be described later, but also includes a case where the cavity 26 is not covered by the substrate 20 on the second main surface side of the silicon substrate 2. Here, a portion of the cavity 26 also defines and functions as a gap 27 that overlaps both a portion of the first wiring portion 61 and a portion of the second wiring portion 62 in a plan view from the thickness direction D1 of the piezoelectric layer 4. Additionally, in the acoustic wave device 1 according to Preferred Embodiment 1, the trap region 10 includes the surface region 2S and the gap 27. Thus, the acoustic wave device 1 according to Preferred Embodiment 1 can improve linearity as compared with a case where the trap region 10 does not include the gap 27.

Another Example of Acoustic Wave Device According to Preferred Embodiment 1

In another example of the acoustic wave device 1, for example, as illustrated in FIG. 13, another substrate 20 may be laminated on the side of the silicon substrate 2 opposite to the piezoelectric layer 4, that is, on the second main surface 22 of the silicon substrate 2, so as to overlap the piezoelectric layer in a plan view from the thickness direction D1 of the piezoelectric layer 4. A material of the other substrate 20 describe above may be silicon, for example. In short, in the acoustic wave device 1, a second silicon substrate including the other substrate 20 described above may be bonded to the second main surface 22 of the first silicon substrate 2, which is the silicon substrate 2. Note that the silicon substrate 2 and the other substrate 20 are not limited to being laminated, and may be integrally provided with one substrate.

Modification 1 of Preferred Embodiment 1

Figure 14:
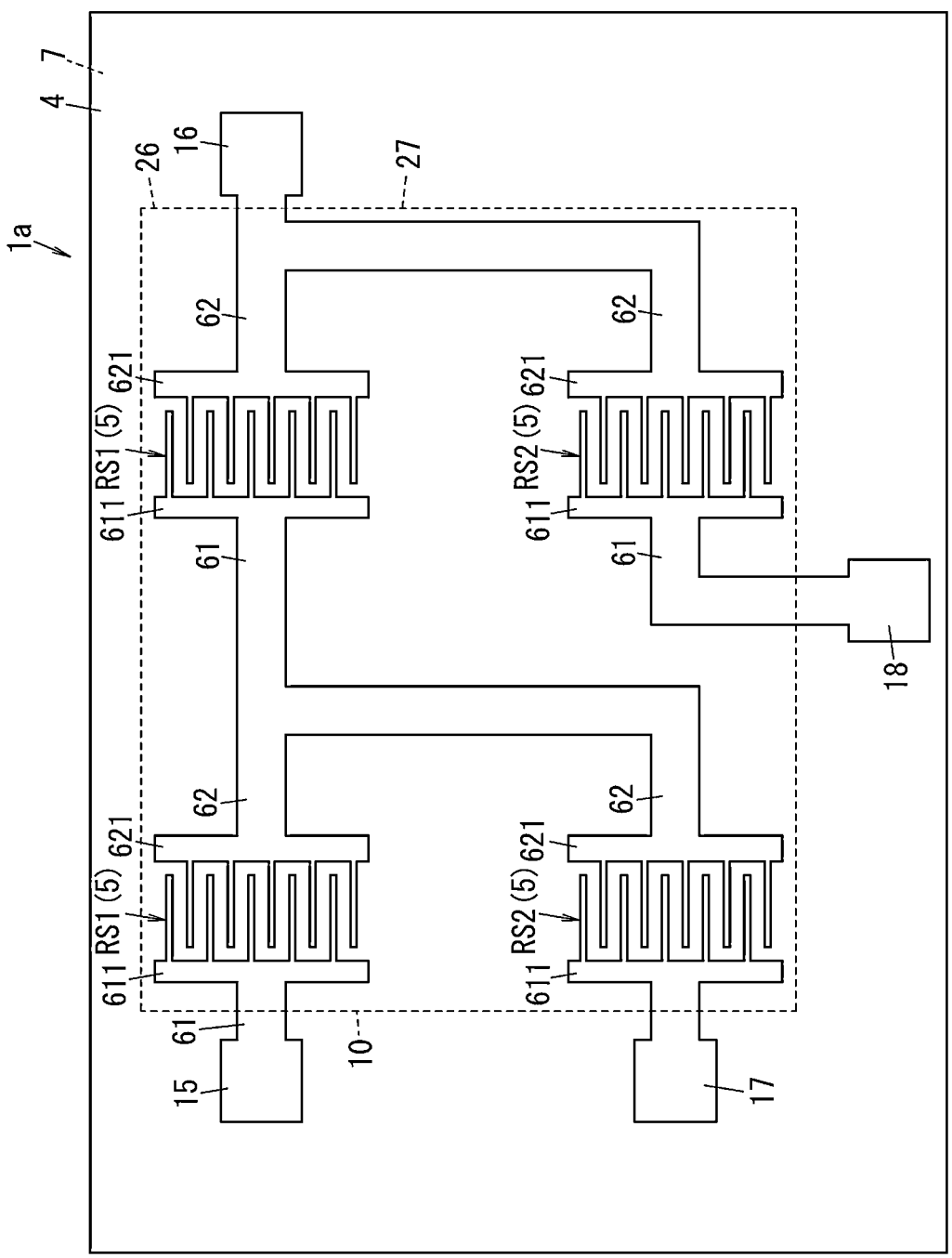
FIG. 14 is a plan view of an acoustic wave device according to Modification 1 of Preferred Embodiment 1 of the present invention.
Figure 15:
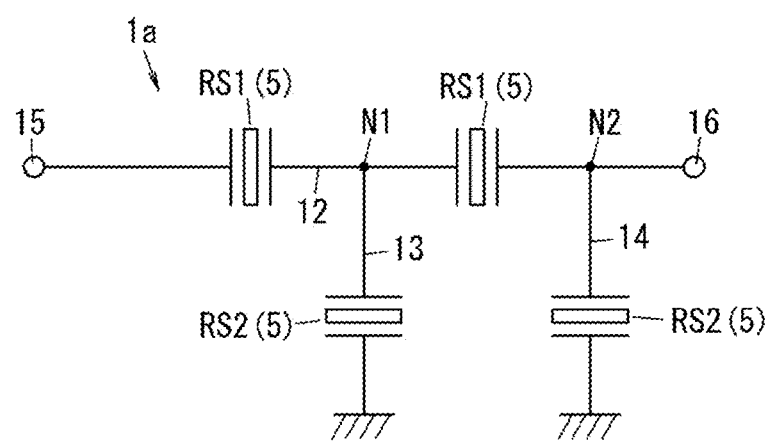
FIG. 15 is an equivalent circuit diagram of the acoustic wave device according to Modification 1 of Preferred Embodiment 1 of the present invention.

Hereinafter, an acoustic wave device 1a according to Modification 1 of Preferred Embodiment 1 will be described with reference to FIGS. 14 and 15. For the acoustic wave device 1a according to Modification 1, elements that are the same as or similar to those of the acoustic wave device 1 according to Preferred Embodiment 1 are denoted by the same reference characters, and description thereof will be omitted.

The acoustic wave device 1a according to Modification 1 is an acoustic wave filter (for example, a ladder filter). The acoustic wave device 1a includes an input terminal 15, an output terminal 16, a plurality of (for example, two) series arm resonators RS1 provided on a first path 12 connecting the input terminal 15 and the output terminal 16, and a plurality of (for example, two) parallel arm resonators RS2 provided one by one on a plurality of (two) second paths 13 and 14 connecting a plurality of (two) nodes N1 and N2 on the first path 12 and the ground (ground terminals 17 and 18). The ground terminals 17 and 18 may be commonly used as one ground.

In the acoustic wave device 1a, each of the series arm resonators RS1 and the parallel arm resonators RS2 is, for example, the acoustic wave resonator 5. Each of a plurality of acoustic wave resonators 5 is a resonator including a plurality of first electrodes 51 and a plurality of second electrodes 52, but is not limited thereto, and is preferably a resonator including at least one first electrode 51 and one second electrode 52. In the acoustic wave device 1a, the piezoelectric layer 4 is shared by the plurality of acoustic wave resonators 5. A resonant frequency of the parallel arm resonator RS2 is lower than a resonant frequency of the series arm resonator RS1. The acoustic wave resonator 5 defining the parallel arm resonator RS2 includes, for example, a silicon oxide film provided on the first main surface 41 of the piezoelectric layer 4, while the acoustic wave resonator 5 defining the series arm resonator RS1 does not include a silicon oxide film on the first main surface 41 of the piezoelectric layer 4. The acoustic wave resonator 5 defining the series arm resonator RS1 may include, for example, a silicon oxide film on the first main surface 41 of the piezoelectric layer 4. In this case, the silicon oxide film of the acoustic wave resonator 5 defining the series arm resonator RS1 may be thinner than the silicon oxide film of the acoustic wave resonator 5 defining the parallel arm resonator RS2.

In the acoustic wave device 1a, the silicon substrate 2 includes a portion of the cavity 26 overlapping the plurality of acoustic wave resonators 5 in a plan view from the thickness direction D1 of the piezoelectric layer 4, but is not limited thereto, and may include, for example, a portion of each of a plurality of cavities 26 overlapping the plurality of acoustic wave resonators 5 in a one-by-one manner.

Modification 2 of Preferred Embodiment 1

Figure 16:
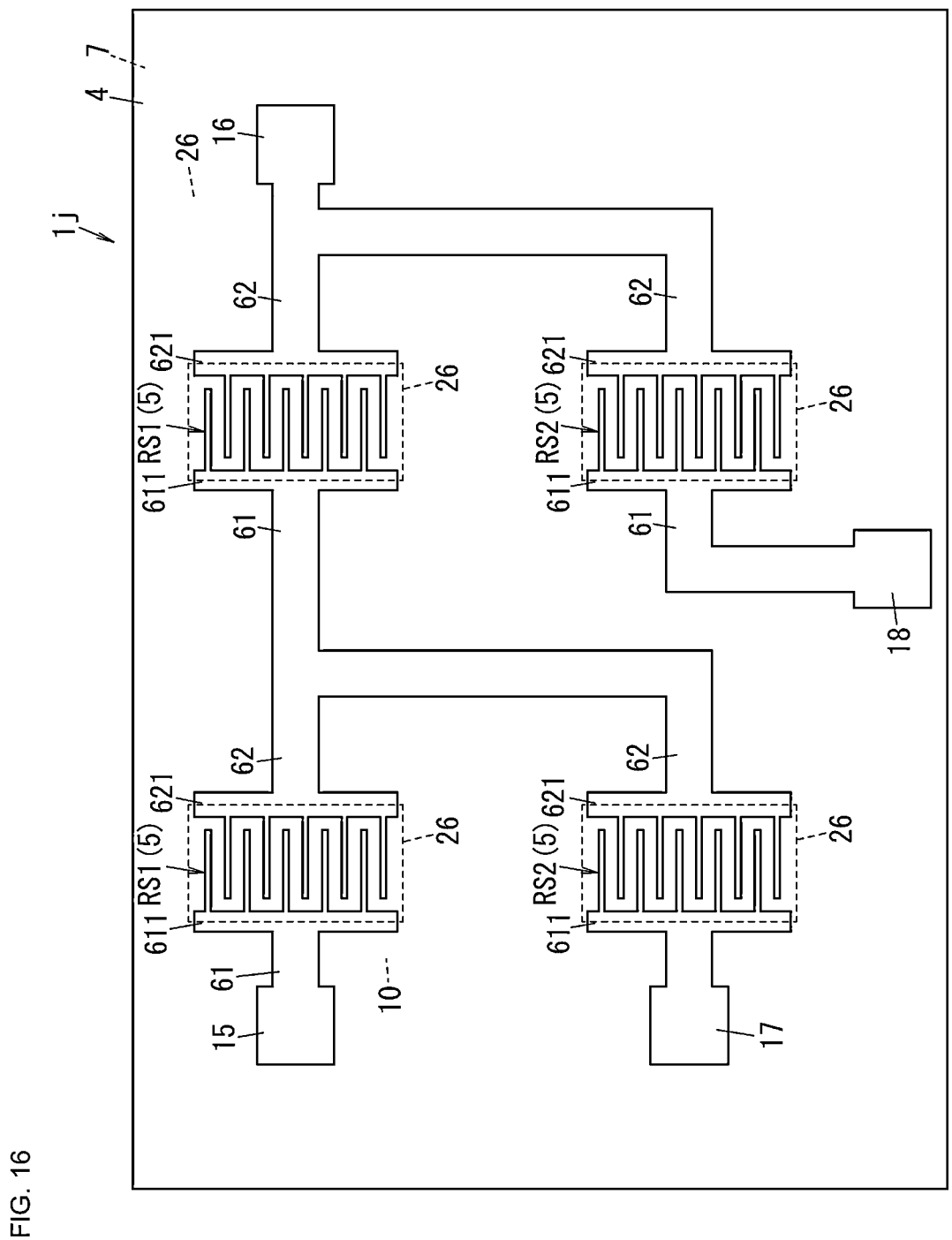
FIG. 16 is a plan view of an acoustic wave device according to Modification 2 of Preferred Embodiment 1 of the present invention.

Hereinafter, an acoustic wave device 1j according to Modification 2 of Preferred Embodiment 1 will be described with reference to FIG. 16. For the acoustic wave device 1j according to Modification 2, elements the same as or similar to those of the acoustic wave device 1 according to Preferred Embodiment 1 are denoted by the same reference characters, and description thereof will be omitted.

In the acoustic wave device 1j according to Modification 2, the gap 27 of the acoustic wave device 1 according to Preferred Embodiment 1 is not provided, and the silicon substrate 2 and the silicon oxide film 7 overlap both a portion of the first wiring portion 61 and a portion of the second wiring portion 62 in a plan view from the thickness direction D1 of the piezoelectric layer 4. Here, in the acoustic wave device 1j according to Modification 2, the surface region 2S overlapping the entire or substantially the entire silicon oxide film 7 overlaps both a portion of the first wiring portion 61 and a portion of the second wiring portion 62 in a plan view from the thickness direction D1 of the piezoelectric layer 4. Thus, in the acoustic wave device 1j according to Modification 2, the surface region 2S included in the trap region 10 is provided so as to overlap a plurality of external connection terminals (the input terminal 15, the output terminal 16, and the ground terminals 17 and 18) in a plan view.

Modification 3 of Preferred Embodiment 1

Figure 17:
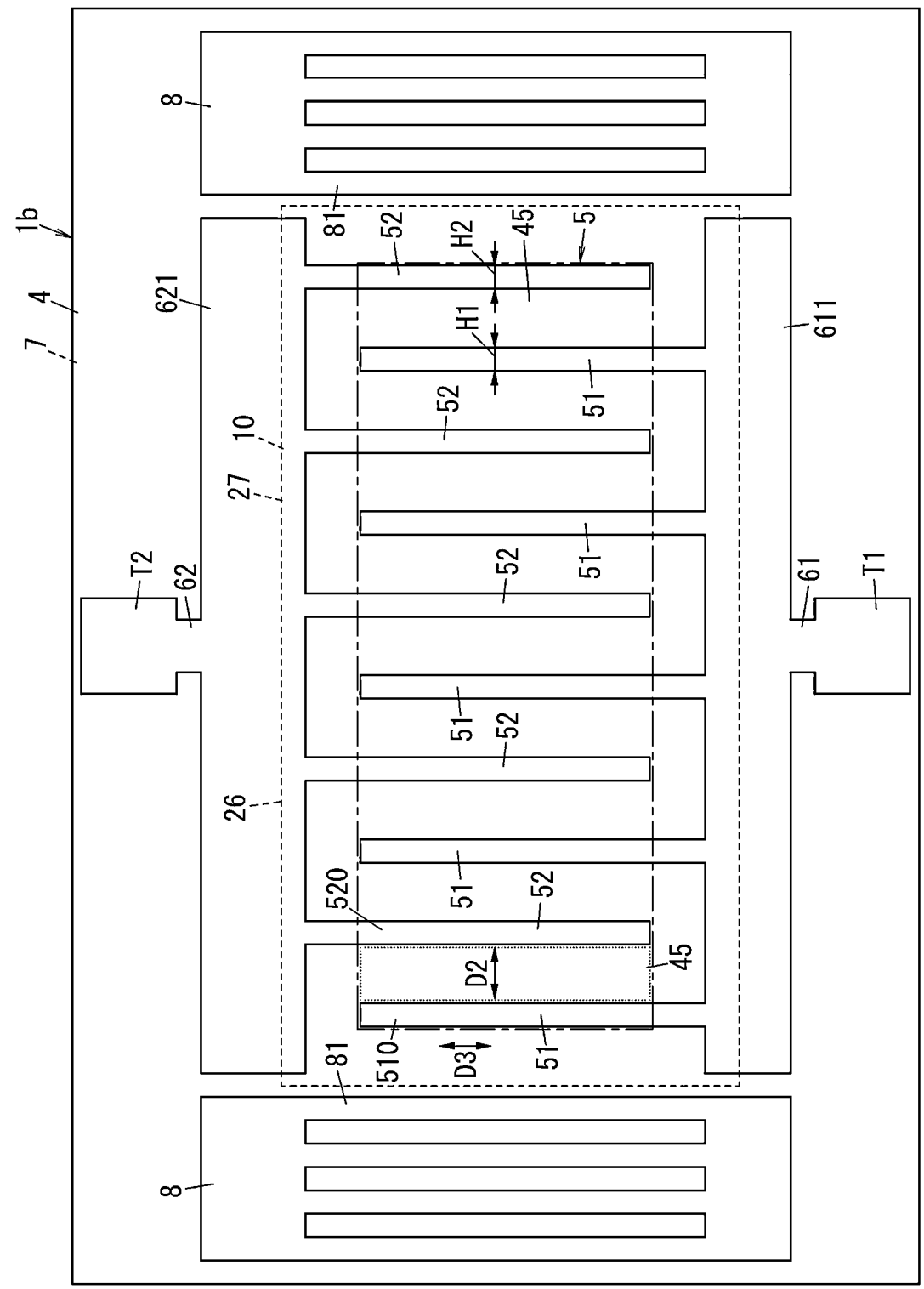
FIG. 17 is a plan view of an acoustic wave device according to Modification 3 of Preferred Embodiment 1 of the present invention.

Hereinafter, an acoustic wave device 1b according to Modification 3 of Preferred Embodiment 1 will be described with reference to FIG. 17. For the acoustic wave device 1b according to Modification 3, elements the same as or similar to those of the acoustic wave device 1 according to Preferred Embodiment 1 are denoted by the same reference characters, and description thereof will be omitted.

The acoustic wave device 1b according to Modification 3 differs from the acoustic wave device 1 according to Preferred Embodiment 1 in that two reflectors 8 are further provided.

Each of the two reflectors 8 is a short-circuited grating. Each reflector 8 does not reflect a bulk wave of a primary shear mode but reflects an unnecessary surface acoustic wave propagating along the first main surface 41 of the piezoelectric layer 4. One reflector 8 of the two reflectors 8 is positioned on the side opposite to the second electrode 52 side of the first electrode 51 positioned at an end among the plurality of first electrodes 51 in a direction along a propagation direction of the unnecessary surface acoustic wave of the acoustic wave device 1b. The remaining other reflector 8 of the two reflectors 8 is positioned on the side opposite to the first electrode 51 side of the second electrode 52 positioned at an end among the plurality of second electrodes 52 in the direction along the propagation direction of the unnecessary surface acoustic wave of the acoustic wave device 1b.

Each reflector 8 includes a plurality of (for example, four) electrode fingers 81, and one end of each of the plurality of electrode fingers 81 is short-circuited to each other, and the other end is short-circuited to each other. In each reflector 8, the number of electrode fingers 81 is not particularly limited.

Each reflector 8 has electrical conductivity. A material of each reflector 8 is, for example, Al, Cu, Pt, Au, Ag, Ti, Ni, Cr, Mo, or W, an alloy mainly including any one of these metals, or the like. Further, each reflector 8 may have a structure in which a plurality of metal films made of these metals or the alloy are laminated. Each reflector 8 includes, for example, a laminated film of an adhesion film made of a Ti film provided on the piezoelectric layer 4 and a main electrode film made of an Al film provided on the adhesion film. The adhesion film has a thickness of, for example, about 10 nm. Additionally, the main electrode film has a thickness of, for example, about 80 nm.

Further, in the acoustic wave device 1b according to Modification 2, each reflector 8 is the short-circuited grating, but is not limited thereto, and may be, for example, an open-circuited grating, a positive/negative reflection grating, a grating in which a short-circuited grating and an open-circuited grating are combined, or the like. In addition, the acoustic wave device 1b includes the two reflectors 8, but may include only one of the two reflectors 8.

The two reflectors 8 in the acoustic wave device 1b according to Modification 2 are also applicable to the acoustic wave device 1a according to Modification 1. For example, the two reflectors 8 may be provided for each acoustic wave resonator 5 of the acoustic wave device 1a according to Modification 1.

Preferred Embodiment 2

Figure 18:
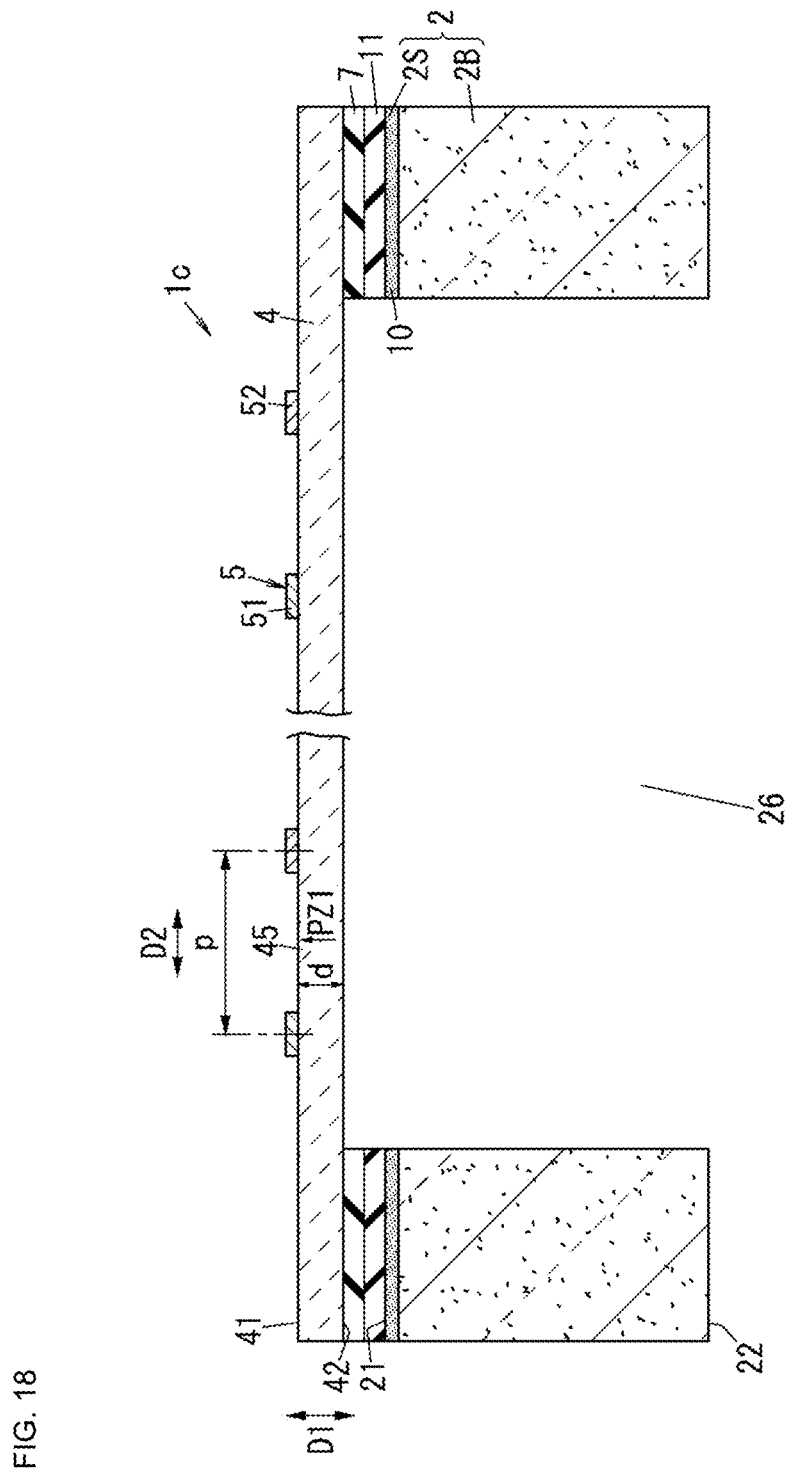
FIG. 18 is a cross-sectional view of an acoustic wave device according to Preferred Embodiment 2 of the present invention.

Hereinafter, an acoustic wave device 1c according to Preferred Embodiment 2 of the present invention will be described with reference to FIG. 18. For the acoustic wave device 1c according to Preferred Embodiment 2, elements the same as or similar to those of the acoustic wave device 1 according to Preferred Embodiment 1 are denoted by the same reference characters, and description thereof will be omitted.

The acoustic wave device 1c according to Preferred Embodiment 2 includes, for example, a silicon nitride film 11 as an insulating film directly provided on the first main surface 21 of the silicon substrate 2. Thus, a weight ratio of oxygen in the insulating film is smaller than that in silicon oxide. The silicon nitride film 11 is a sputtered thin film formed by sputtering.

In the acoustic wave device 1c according to Preferred Embodiment 2, the silicon oxide film 7 is interposed between the silicon nitride film 11 and the piezoelectric layer 4, and is in contact with the silicon nitride film 11 and the piezoelectric layer 4. Thus, in the acoustic wave device 1c according to Preferred Embodiment 2, the silicon nitride film 11 and the surface region 2S are provided between the silicon oxide film 7 and the bulk region 2B of the silicon substrate 2.

In the acoustic wave device 1c according to Preferred Embodiment 2, the trap region 10 includes the surface region 2S of the silicon substrate 2.

Since the acoustic wave device 1c according to Preferred Embodiment 2 includes the trap region 10 as in the acoustic wave device 1 according to Preferred Embodiment 1, linearity can be improved.

In the acoustic wave device 1c according to Preferred Embodiment 2, the silicon oxide film 7 is not necessarily included, and the silicon nitride film 11 and the piezoelectric layer 4 may be in contact with each other.

Also, in the acoustic wave device 1c according to Preferred Embodiment 2, the silicon oxide film 7 may be formed by, for example, sputtering without the silicon nitride film 11.

Preferred Embodiment 3

Figure 19:
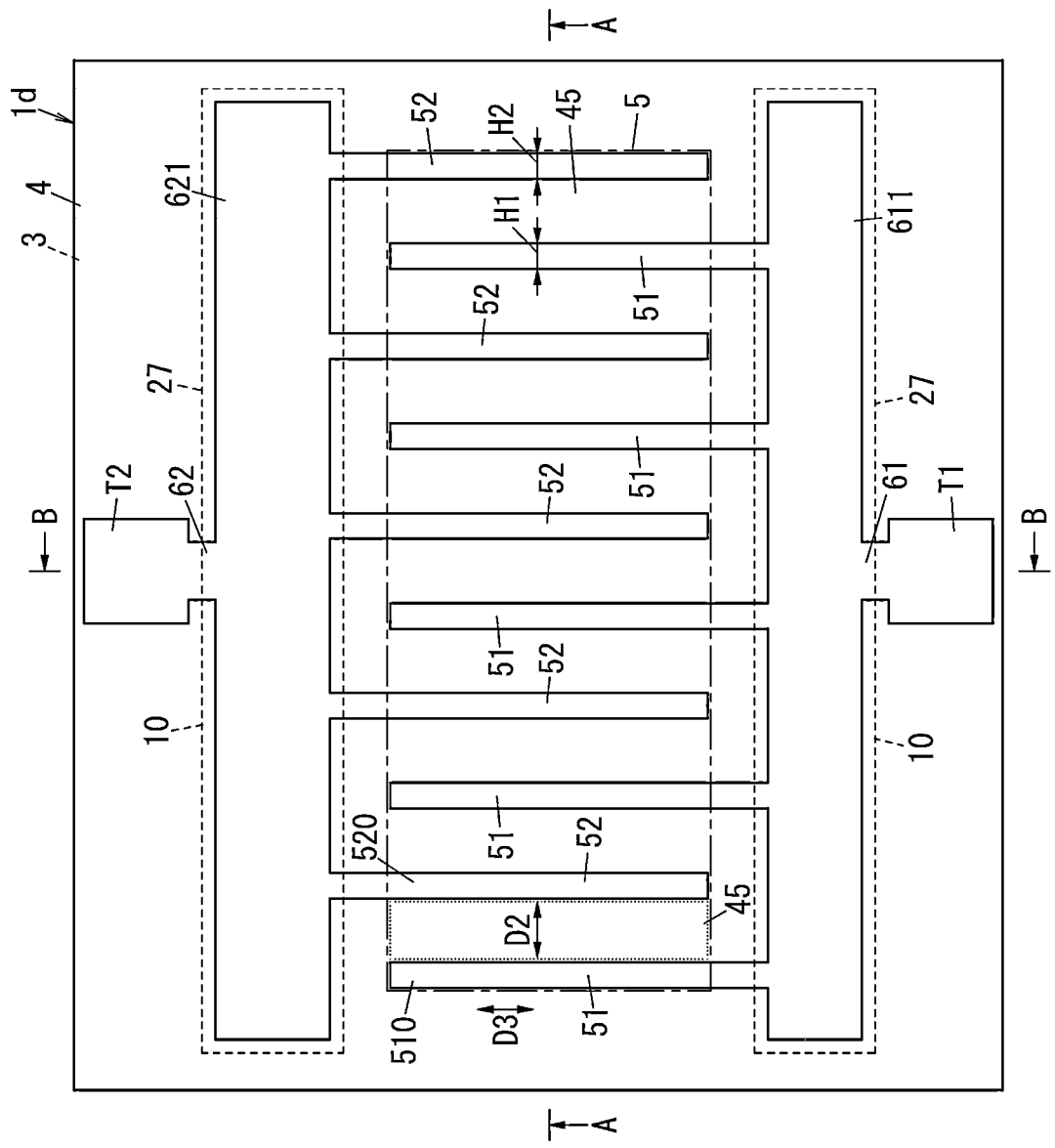
FIG. 19 is a plan view of an acoustic wave device according to Preferred Embodiment 2 of the present invention.

Hereinafter, an acoustic wave device 1d according to Preferred Embodiment 3 of the present invention will be described with reference to FIGS. 19 to 21. For the acoustic wave device 1d according to Preferred Embodiment 3, elements the same as or similar to those of the acoustic wave device 1 according to Preferred Embodiment 1 are denoted by the same reference characters, and description thereof will be omitted.

Figure 20:
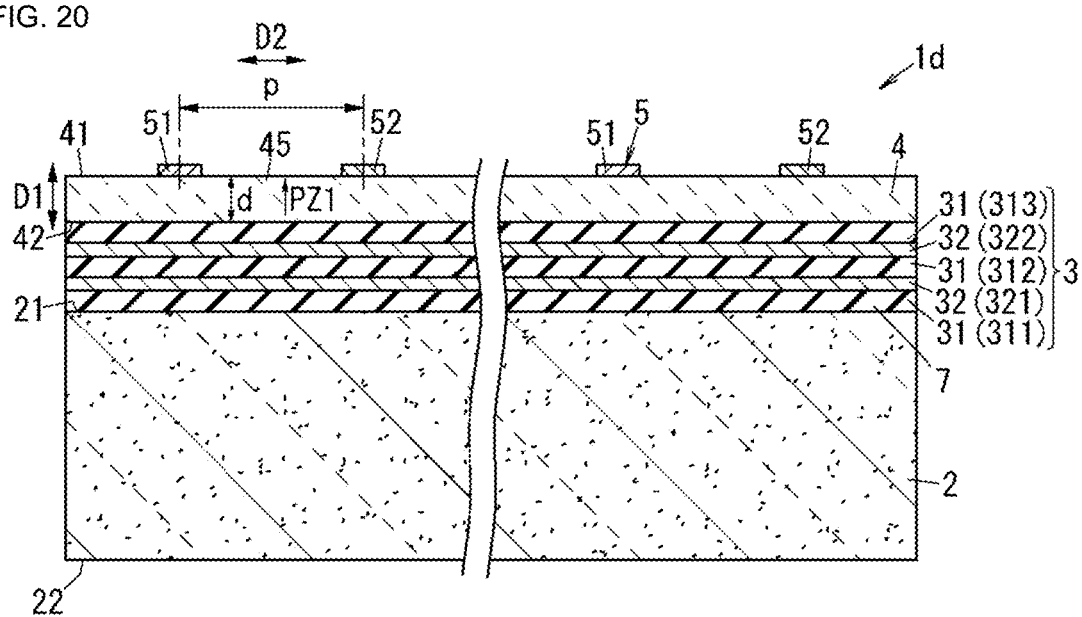
FIG. 20 is a cross-sectional view of the acoustic wave device taken along a line A-A of FIG. 19.
Figure 21:
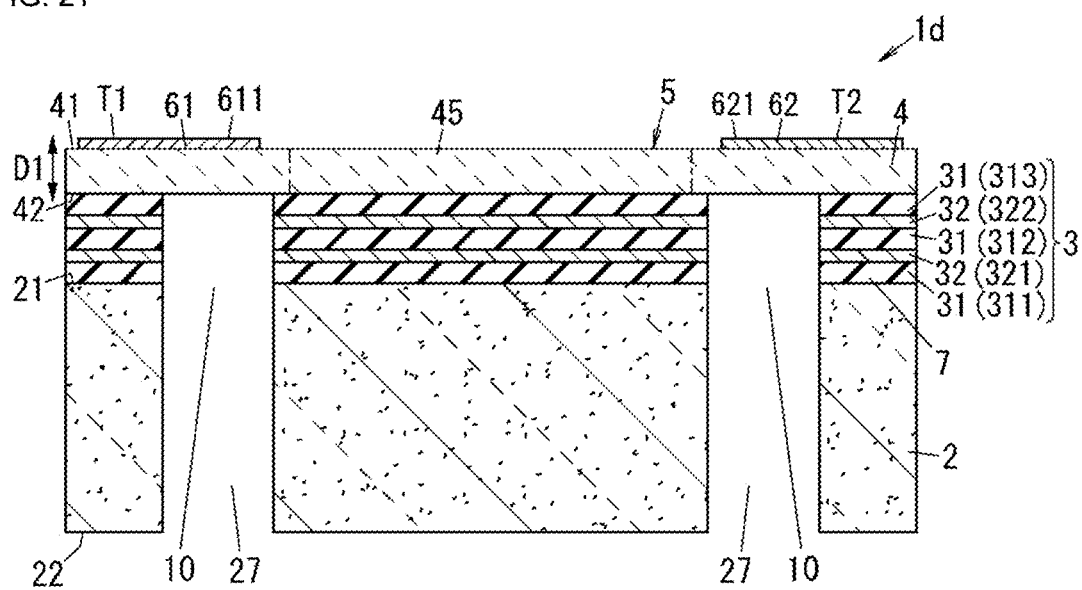
FIG. 21 is a cross-sectional view of the acoustic wave device taken along a line B-B of FIG. 19.

As illustrated in FIG. 20, the acoustic wave device 1d according to Preferred Embodiment 3 differs from the acoustic wave device 1 according to Preferred Embodiment 1 in that the acoustic wave device 1d includes an acoustic reflection layer 3 interposed between the silicon substrate 2 and the piezoelectric layer 4, and does not include the cavity 26 in the acoustic wave device 1 according to Preferred Embodiment 1. Additionally, the acoustic wave device 1d according to Preferred Embodiment 3 is different from the acoustic wave device 1 according to Preferred Embodiment 1 in that the silicon substrate 2 includes a portion of each of two gaps 27 (see FIGS. 19 and 21) individually overlapping a portion of the first wiring portion 61 and a portion of the second wiring portion 62 in a plan view from the thickness direction D1 of the piezoelectric layer 4. The acoustic wave device 1d according to Preferred Embodiment 3 includes two trap regions 10. Each of the two trap regions 10 includes the gap 27. Each trap region 10 is provided in the silicon substrate 2 on the second main surface 42 side of the piezoelectric layer 4, and reduces or prevents the movement of charges along the first main surface 21 of the silicon substrate 2.

In the acoustic wave device 1d according to Preferred Embodiment 3, the acoustic reflection layer 3 is provided on the first main surface 21 of the silicon substrate 2, and the piezoelectric layer 4 is provided on the acoustic reflection layer 3. In the acoustic wave device 1d, the acoustic wave resonator 5 includes the first electrode 51 and the second electrode 52, and the piezoelectric layer 4. In the acoustic wave device 1d, the acoustic wave resonator 5 further includes the acoustic reflection layer 3 described above.

The acoustic reflection layer 3 is opposed to a plurality of first electrodes 51 and a plurality of second electrodes 52 in the thickness direction D1 of the piezoelectric layer 4.

The acoustic reflection layer 3 reduces or prevents leakage of a bulk wave excited by the first electrode 51 and the second electrode 52 (a bulk wave of the thickness-shear primary mode described above) to the silicon substrate 2. By including the acoustic reflection layer 3, the acoustic wave device 1d can improve the effect of confining acoustic wave energy in the piezoelectric layer 4. Thus, the acoustic wave device 1d can reduce the loss and can increase the Q value as compared with a case where the acoustic reflection layer 3 is not provided.

The acoustic reflection layer 3 has a laminated structure including a plurality of (for example, three) low acoustic impedance layers 31 and a plurality of (for example, two) high acoustic impedance layers 32 that are alternately provided one by one in the thickness direction D1 of the piezoelectric layer 4. An acoustic impedance of the low acoustic impedance layer 31 is lower than an acoustic impedance of the high acoustic impedance layer 32.

Hereinafter, for convenience of explanation, in the acoustic reflection layer 3, the two high acoustic impedance layers 32 may be referred to as a first high acoustic impedance layer 321 and a second high acoustic impedance layer 322 in the order of proximity to the first main surface 21 of the silicon substrate 2. Further, the three low acoustic impedance layers 31 may be referred to as a first low acoustic impedance layer 311, a second low acoustic impedance layer 312, and a third low acoustic impedance layer 313 in the order of proximity to the first main surface 21 of the silicon substrate 2.

In the acoustic reflection layer 3, the first low acoustic impedance layer 311, the first high acoustic impedance layer 321, the second low acoustic impedance layer 312, the second high acoustic impedance layer 322, and the third low acoustic impedance layer 313 are provided in this order from the silicon substrate 2 side. Thus, the acoustic reflection layer 3 can reflect a bulk wave (a bulk wave of the thickness-shear primary mode) from the piezoelectric layer 4 at each of an interface between the third low acoustic impedance layer 313 and the second high acoustic impedance layer 322, an interface between the second high acoustic impedance layer 322 and the second low acoustic impedance layer 312, an interface between the second low acoustic impedance layer 312 and the first high acoustic impedance layer 321, and an interface between the first high acoustic impedance layer 321 and the first low acoustic impedance layer 311.

A material of the plurality of high acoustic impedance layers 32 is, for example, platinum (Pt). Additionally, a material of the plurality of low acoustic impedance layers 31 is, for example, silicon oxide. A thickness of each of the plurality of high acoustic impedance layers 32 is, for example, about 94 nm. Further, a thickness of each of the plurality of low acoustic impedance layers 31 is, for example, about 188 nm. The acoustic reflection layer 3 includes two electrically conductive layers because each of the two high acoustic impedance layers 32 is made of platinum.

The material of the plurality of high acoustic impedance layers 32 is not limited to Pt, and may be metal such as W (tungsten) or Ta (tantalum), for example. In addition, the material of the plurality of high acoustic impedance layers 32 is not limited to metal, and may be, for example, an insulator.

Further, the plurality of high acoustic impedance layers 32 are not limited to being made of the same material, and may be made of different materials, for example. Furthermore, the plurality of low acoustic impedance layers 31 are not limited to being made of the same material, and may be made of different materials, for example.

Further, the number of the high acoustic impedance layers 32 and the number of the low acoustic impedance layers 31 in the acoustic reflection layer 3 are not limited to two and three, respectively, and may be, for example, one, three or more, or four or more. In addition, the number of high acoustic impedance layers 32 and the number of low acoustic impedance layers 31 are not limited to being different, and may be the same, or the number of low acoustic impedance layers 31 may be one less than the number of high acoustic impedance layers 32. In addition, the thickness of each of the high acoustic impedance layer 32 and the low acoustic impedance layer 31 is appropriately set according to a designed frequency of the acoustic wave device 1 and the material applied to each of the high acoustic impedance layer 32 and the low acoustic impedance layer 31 so that favorable reflection can be obtained in the acoustic reflection layer 3.

In the acoustic wave device 1d according to the Preferred Embodiment 3, the gap 27 is provided over the silicon substrate 2 and the acoustic reflection layer 3, and exposes a portion of the second main surface 42 of the piezoelectric layer 4.

In a non-limiting example of a method of manufacturing the acoustic wave device 1d, for example, the silicon substrate 2 including the first main surface 21 and the second main surface 22 that are opposed to each other is prepared, and then, the first process to the fifth process are performed. In the first process, the acoustic reflection layer 3 is formed on the first main surface of the silicon substrate 2. In the second process, a piezoelectric substrate from which the piezoelectric layer 4 is formed and the silicon substrate 2 are bonded to each other with the acoustic reflection layer 3 interposed therebetween. In the third process, the piezoelectric layer 4 made of a portion of the piezoelectric substrate is formed by thinning the piezoelectric substrate. In the fourth process, the plurality of first electrodes 51, the plurality of second electrodes 52, the first wiring portion 61, the second wiring portion 62, the first terminal T1, and the second terminal T2 are formed on the piezoelectric layer 4. In the fifth process, a portion of each of the silicon substrate 2 and the acoustic reflection layer 3 is etched from the second main surface 22 of the silicon substrate 2 to form the gap 27. In the fifth process, a portion of the silicon substrate 2 may be etched from the first main surface 21 of the silicon substrate 2. In the first to fifth processes, a silicon wafer is used as the silicon substrate 2. Additionally, in the second process, a piezoelectric wafer is used as the piezoelectric substrate. In the method of manufacturing the acoustic wave device 1d, a wafer including a plurality of acoustic wave devices 1d is cut with a dicing machine to obtain the plurality of acoustic wave devices 1d (chips).

The method of manufacturing the acoustic wave device 1d is an example and is not particularly limited thereto. For example, the piezoelectric layer 4 may be formed by a film formation technique. In this case, the method of manufacturing the acoustic wave device 1d includes a process of forming the piezoelectric layer 4 instead of the second process and the third process. The piezoelectric layer 4 formed as a film by the film formation technique may be, for example, single crystal or twin crystal. Examples of the film formation technique include, but are not limited to, a CVD method.

As with the acoustic wave device 1 according to Preferred Embodiment 1, the acoustic wave device 1d according to Preferred Embodiment 3 uses a bulk wave of the thickness-shear primary mode. As a result, in the acoustic wave device 1d according to Preferred Embodiment 3, the resonant frequency is not limited by the distance between the center lines of the first electrode 51 and the second electrode 52 that are adjacent to each other, and the resonant frequency can be increased by reducing the thickness of the piezoelectric layer 4. Thus, it is possible to handle higher frequencies without increasing the planar size of the acoustic wave device 1d. In addition, the acoustic wave device 1d according to Preferred Embodiment 3 includes the trap region 10 as in the acoustic wave device 1 according to Preferred Embodiment 1, and thus, can improve linearity.

The acoustic wave device 1d includes the trap region 10 overlapping at least a portion of the first wiring portion 61 in the thickness direction D1 of the piezoelectric layer 4 and the trap region 10 overlapping at least a portion of the second wiring portion 62 in the thickness direction D1 of the piezoelectric layer 4, but as long as the acoustic wave device 1d includes at least one of the trap regions 10, linearity can be improved.

Further, in the acoustic wave device 1d according to Preferred Embodiment 3, an unnecessary wave can be reduced or prevented by the acoustic reflection layer 3 in the acoustic wave resonator 5. Further, in the acoustic wave device 1d according to Preferred Embodiment 3, a material of the piezoelectric layer 4 is, for example, $LiNbO_3$ or $LiTaO_3$, and a material of the low acoustic impedance layer 31 is, for example, silicon oxide. Here, frequency-temperature characteristics of each of $LiNbO_3$ and $LiTaO_3$ have a negative slope, and frequency-temperature characteristics of silicon oxide have a positive slope. Thus, with the acoustic wave device 1d according to Preferred Embodiment 3, an absolute value of a temperature coefficient of frequency (TCF) can be reduced, and the frequency-temperature characteristics can be improved.

Modification 1 of Preferred Embodiment 3

Figure 22:
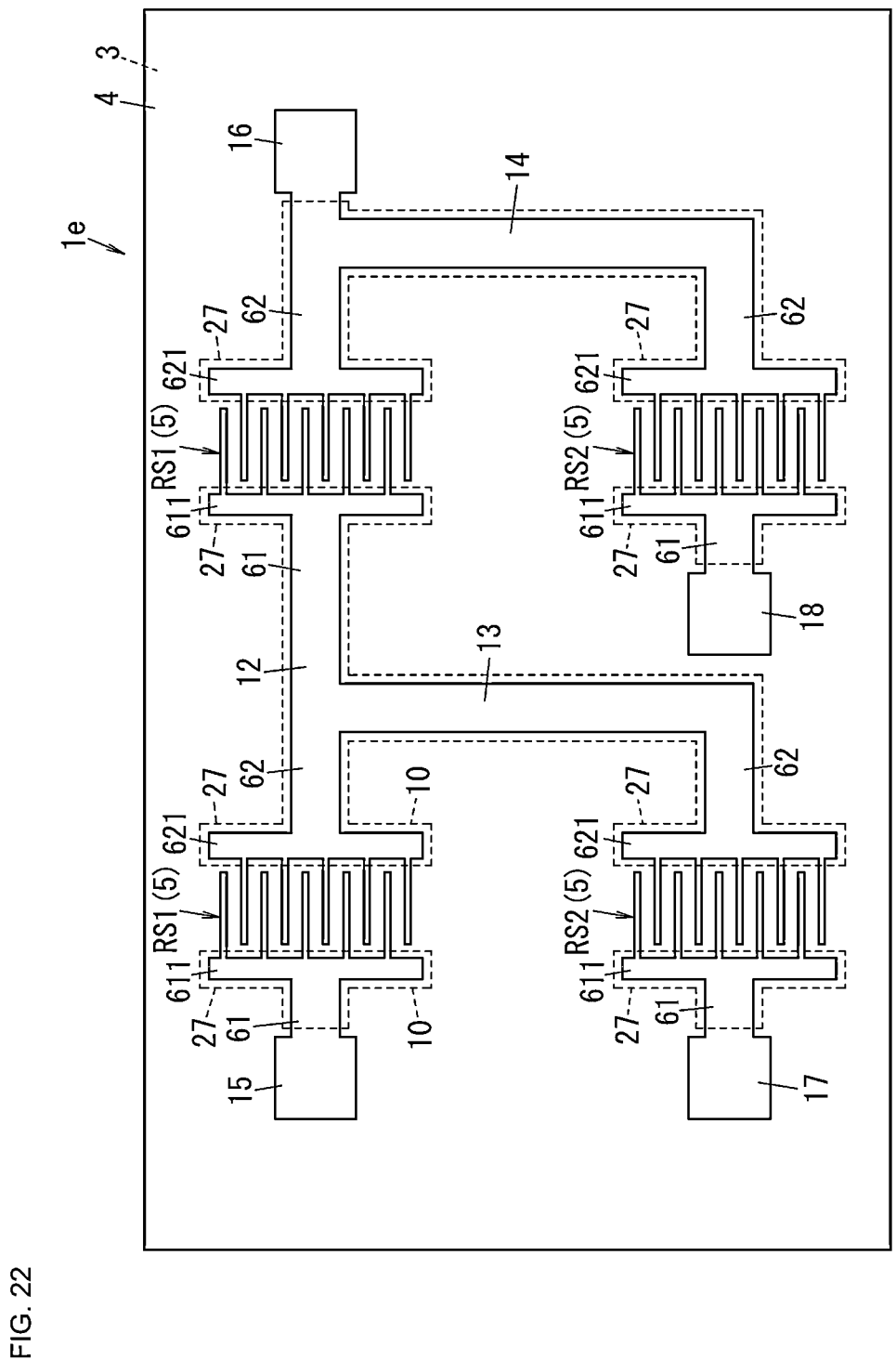
FIG. 22 is a plan view of an acoustic wave device according to Modification 1 of Preferred Embodiment 2 of the present invention.

Hereinafter, an acoustic wave device 1e according to Modification 1 of Preferred Embodiment 3 will be described with reference to FIG. 22. For the acoustic wave device 1e according to Modification 1, elements the same as or similar to those of the acoustic wave device 1d according to Preferred Embodiment 3 are denoted by the same reference characters, and description thereof will be omitted.

The acoustic wave device 1e according to Modification 1 of Preferred Embodiment 3 is an acoustic wave filter (here, a ladder filter) similar to the acoustic wave device 1a according to Modification 1 of Preferred Embodiment 1. The acoustic wave device 1e includes the input terminal 15, the output terminal 16, a plurality of (for example, two) series arm resonators RS1 provided on the first path 12 connecting the input terminal 15 and the output terminal 16, and a plurality of (for example, two) parallel arm resonators RS2 provided one by one on a plurality of (for example, two) second paths 13 and 14 connecting a plurality of (two) nodes N1 and N2 on the first path 12 and the ground (ground terminals 17 and 18). The ground terminals 17 and 18 may be commonly used as one ground.

In the acoustic wave device 1e according to Modification 1 of Preferred Embodiment 3, each of the plurality of series arm resonators RS1 and the plurality of parallel arm resonators RS2 is the acoustic wave resonator 5. Each of the acoustic wave resonators 5 is a resonator including the first electrode 51 and the second electrode 52. In the acoustic wave device 1e, the piezoelectric layer 4 is shared by the plurality of acoustic wave resonators 5. Further, in the acoustic wave device 1e, the acoustic reflection layer 3 is shared by the plurality of acoustic wave resonators 5. A resonant frequency of the parallel arm resonator RS2 is lower than a resonant frequency of the series arm resonator RS1. Here, the acoustic wave resonator 5 defining the parallel arm resonator RS2 includes, for example, a silicon oxide film provided on the first main surface 41 of the piezoelectric layer 4, whereas the acoustic wave resonator 5 defining the series arm resonator RS1 does not include a silicon oxide film on the first main surface 41 of the piezoelectric layer 4. The acoustic wave resonator 5 defining the series arm resonator RS1 may include, for example, a silicon oxide film on the first main surface 41 of the piezoelectric layer 4. In this case, the silicon oxide film of the acoustic wave resonator 5 defining the series arm resonator RS1 is preferably thinner in thickness than the silicon oxide film of the acoustic wave resonator 5 defining the parallel arm resonator RS2.

In the acoustic wave device 1e according to Modification 1 of Preferred Embodiment 3, the acoustic reflection layer 3 is shared by the plurality of acoustic wave resonators 5. However, the high acoustic impedance layer 32 (the second high acoustic impedance layer 322) closest to the piezoelectric layer 4 among the plurality of high acoustic impedance layers 32 may be separated for each acoustic wave resonator 5. Additionally, in the acoustic wave device 1e according to Modification 1 of Preferred Embodiment 3, the first high acoustic impedance layer 321 is more preferably separated for each acoustic wave resonator 5.

In the acoustic wave device 1e according to Modification 1 of Preferred Embodiment 3, the gap 27 overlaps a portion of each of the first wiring portion 61 and the second wiring portion 62 that are connected to each of the plurality of acoustic wave resonators 5 in a plan view from the thickness direction D1 of the piezoelectric layer 4. In the acoustic wave device 1e according to Modification 1 of Preferred Embodiment 3, the gap 27 does not overlap any of a plurality of external connection terminals (the input terminal 15, the output terminal 16, and the ground terminals 17 and 18) in a plan view from the thickness direction D1 of the piezoelectric layer 4. In the acoustic wave device 1e according to Modification 1 of Preferred Embodiment, most of the first path 12 overlaps the gap 27 and most of each of the second paths 13 and 14 overlaps the gap 27 in a plan view from the thickness direction D1 of the piezoelectric layer 4. In the acoustic wave device 1e according to Modification 1 of Preferred Embodiment 3, the gap 27 overlapping the second wiring portion 62 connected to the series arm resonator RS1 and the gap 27 overlapping the second wiring portion 62 connected to the parallel arm resonator RS2 are connected to each other. As a result, in the acoustic wave device 1e according to Modification 1 of Preferred Embodiment 3, movement of charges along the first main surface 21 of the silicon substrate 2 can be further suppressed. Since the acoustic wave device 1e according to Modification 1 of Preferred Embodiment 3 includes the trap regions 10, linearity can be improved.

Modification 2 of Preferred Embodiment 3

Figure 23:
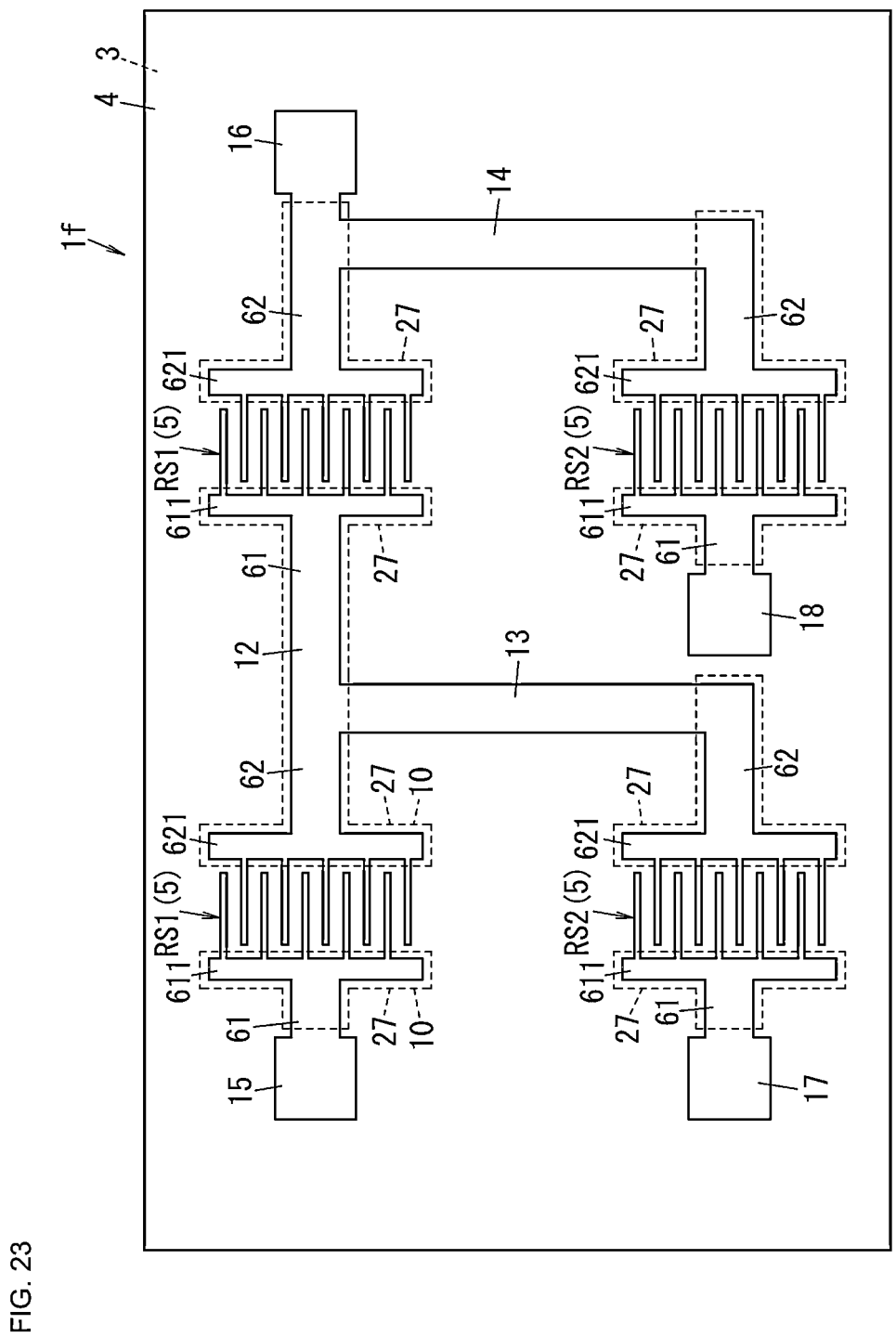
FIG. 23 is a plan view of an acoustic wave device according to Modification 2 of Preferred Embodiment 2 of the present invention.

Hereinafter, an acoustic wave device 1f according to Modification 2 of the Preferred Embodiment 3 will be described with reference to FIG. 23. For the acoustic wave device 1f according to Modification 2 of Preferred Embodiment 3, elements the same as or similar to those of the acoustic wave device 1e according to Modification 1 of Preferred Embodiment 3 are denoted by the same reference characters, and description thereof will be omitted.

The acoustic wave device 1f according to Modification 2 of Preferred Embodiment 3 is different from the acoustic wave device 1e according to Modification 1 of Preferred Embodiment 3 in that the acoustic wave device 1f has a region of each of the second paths 13 and 14 overlapping the gap 27 is smaller than that of the acoustic wave device 1e according to Modification of Preferred Embodiment 3 in a plan view from the thickness direction D1 of the piezoelectric layer 4. In the acoustic wave device 1f according to Modification 2 of Preferred Embodiment 3, the gap 27 overlapping the second wiring portion 62 connected to the series arm resonator RS1 and the gap 27 overlapping the second wiring portion 62 connected to the parallel arm resonator RS2 are separated from each other. The acoustic wave device 1f according to Modification 2 of Preferred Embodiment 3 can have a higher mechanical strength than that of the acoustic wave device 1e according to Modification 1 of Preferred Embodiment 3.

Modification 3 of Preferred Embodiment 3

Figure 24:
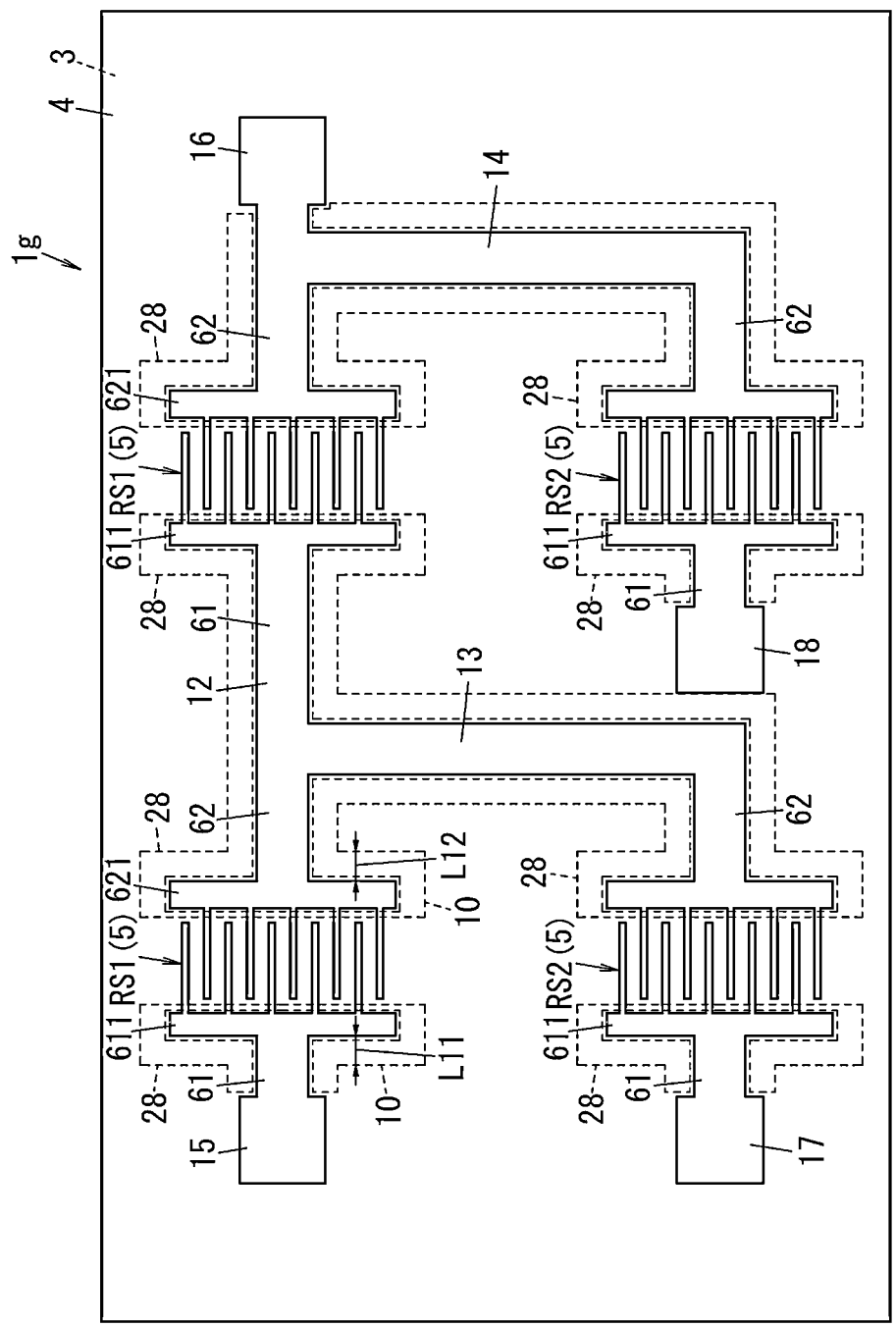
FIG. 24 is a plan view of an acoustic wave device according to Modification 3 of Preferred Embodiment 2 of the present invention.

Hereinafter, an acoustic wave device 1g according to Modification 3 of Preferred Embodiment 3 will be described with reference to FIG. 24. For the acoustic wave device 1g according to Modification 3 of Preferred Embodiment 3, elements the same as or similar to those of the acoustic wave device 1e according to Modification 1 of Preferred Embodiment 3 are denoted by the same reference characters, and description thereof will be omitted.

The acoustic wave device 1g according to Modification 3 of Preferred Embodiment 3 includes a gap 28 in a region different from the gap 27 of the acoustic wave device 1e according to Modification 1 of Preferred Embodiment 3. Similarly to the gap 27, the gap 28 is provided over the silicon substrate 2 and the acoustic reflection layer 3. At least a portion of the gap 28 is positioned within a predetermined distance L11, L12 from a region overlapping a portion of at least one of the first wiring portion and the second wiring portion 62 in a plan view from the thickness direction D1 of the piezoelectric layer 4. The predetermined distance L11, L12 is a distance between either of the first electrode 51 or the second electrode 52 and the silicon substrate 2. The trap region 10 includes the gap 28.

Since the acoustic wave device 1g according to Modification 3 of Preferred Embodiment 3 includes the trap regions 10, linearity can be improved.

Modification 4 of Preferred Embodiment 3

Figure 25:
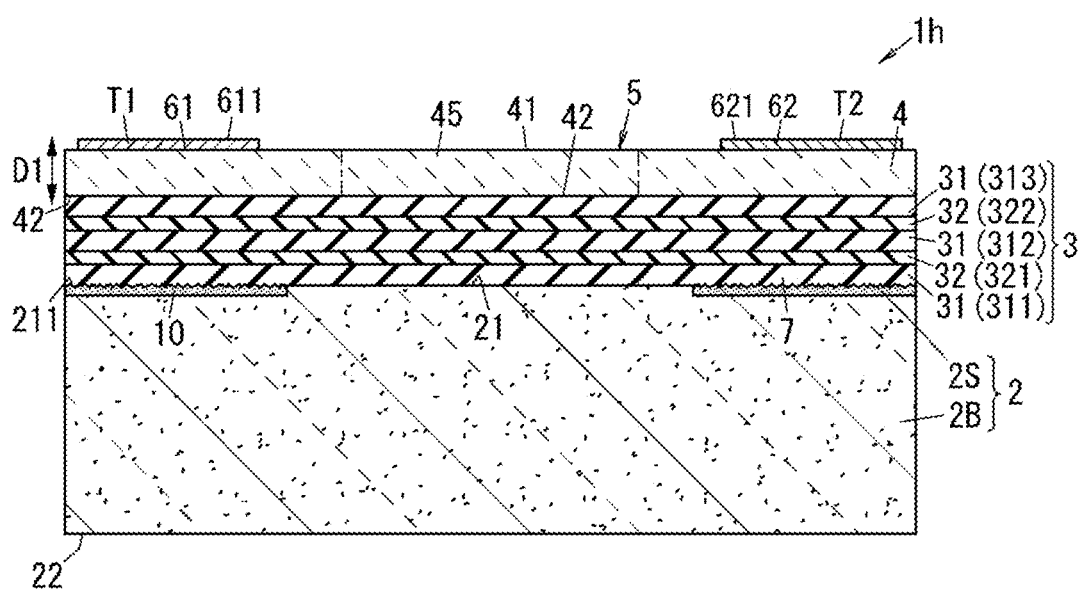
FIG. 25 is a cross-sectional view of an acoustic wave device according to Modification 4 of Preferred Embodiment 2 of the present invention.

Hereinafter, an acoustic wave device 1h according to Modification 4 of Preferred Embodiment 3 will be described with reference to FIG. 25. For the acoustic wave device 1h according to Modification 4 of Preferred Embodiment 3, elements the same as or similar to those of the acoustic wave device 1d according to Preferred Embodiment 3 are denoted by the same reference characters, and description thereof will be omitted.

The acoustic wave device 1h according to Modification 4 of Preferred Embodiment 3 differs from the acoustic wave device 1d according to Preferred Embodiment 3 in that a material of each low acoustic impedance layer 31 and a material of each high acoustic impedance layer 32 in the acoustic reflection layer 3 are different dielectrics from each other. The material of each low acoustic impedance layer 31 is, for example, silicon oxide. The material of each high acoustic impedance layer 32 is, for example, any of silicon nitride, aluminum nitride, alumina, and tantalum oxide.

The acoustic wave device 1h according to Modification 4 of Preferred Embodiment 3 does not include the gap 27 of the acoustic wave device 1d according to Preferred Embodiment 3. In the acoustic wave device 1h according to Modification 4 of Preferred Embodiment 3, the silicon substrate 2 includes the surface region 2S that overlaps a portion of at least one of the first wiring portion 61 and the second wiring portion 62 in a plan view from the thickness direction D1 of the piezoelectric layer 4. The surface region 2S preferably overlaps a portion of at least one of the first wiring portion 61 and the second wiring portion 62.

In the acoustic wave device 1h according to Modification 4 of Preferred Embodiment 3, the silicon substrate 2 includes the bulk region 2B and the surface region 2S, similarly to the silicon substrate 2 of the acoustic wave device 1 according to Preferred Embodiment 1. The surface region 2S is, for example, an amorphous silicon layer. The surface region 2S includes a portion of the first main surface 21 of the silicon substrate 2. The first main surface 21 of the silicon substrate 2 includes the rough surface 211 in the surface region 2S. The surface region 2S is not provided in a region overlapping the acoustic wave resonator 5 in a plan view from the thickness direction D1 of the piezoelectric layer 4.

In the acoustic wave device 1h according to Modification of Preferred Embodiment 3, the trap region 10 includes the surface region 2S. Since the acoustic wave device 1h according to Modification 4 of Preferred Embodiment 3 includes the trap region 10, linearity can be improved.

Modification 5 of Preferred Embodiment 3

Figure 26:
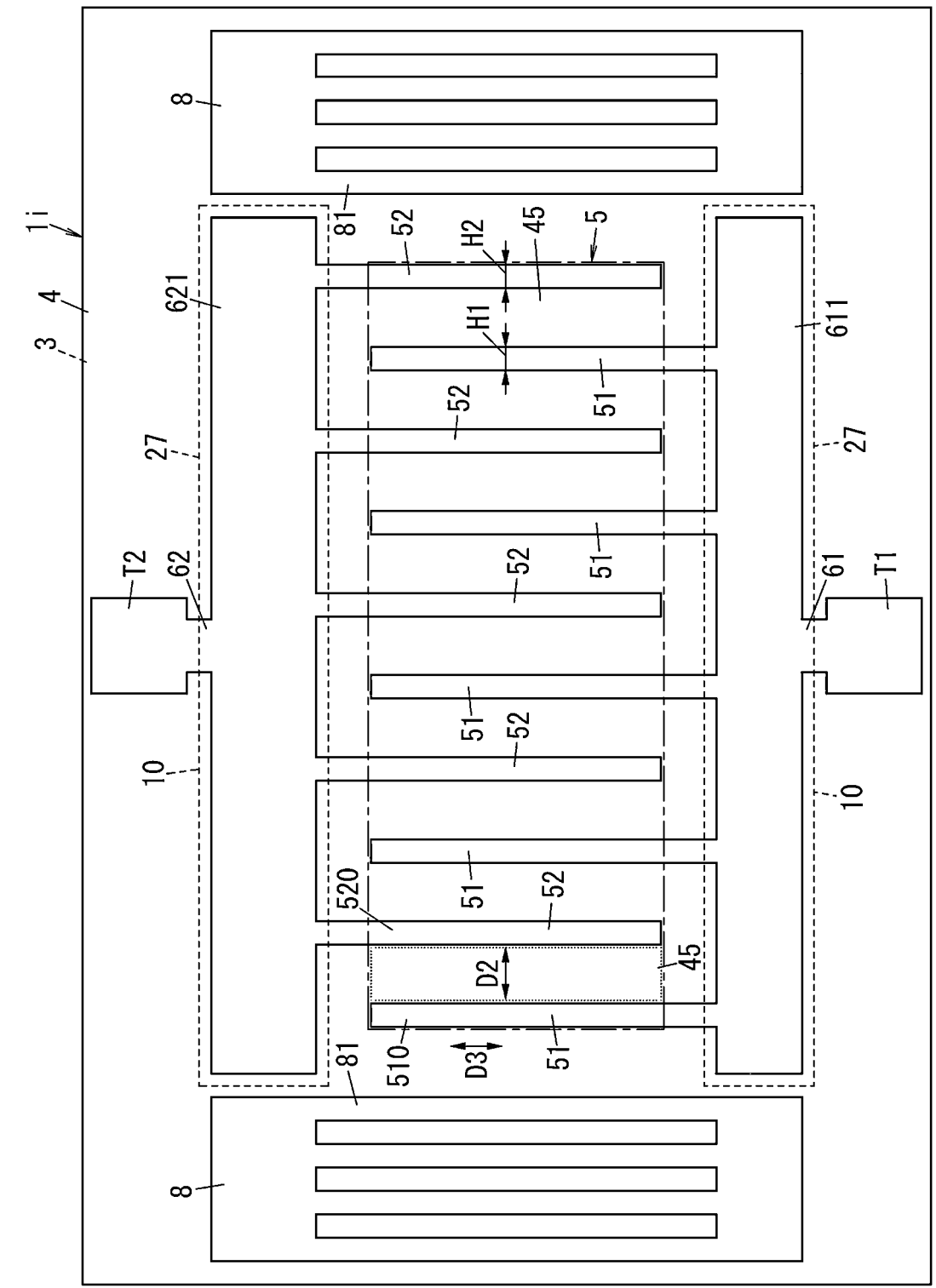
FIG. 26 is a plan view of an acoustic wave device according to Modification 5 of Preferred Embodiment 2 of the present invention.

Hereinafter, an acoustic wave device 1i according to Modification 5 of Preferred Embodiment 3 will be described with reference to FIG. 26. For the acoustic wave device 1i according to Modification 5 of Preferred Embodiment 3, elements the same as or similar to those of the acoustic wave device 1d according to Preferred Embodiment 3 are denoted by the same reference characters, and description thereof will be omitted.

The acoustic wave device 1i according to Modification 5 of Preferred Embodiment 3 is different from the acoustic wave device 1d according to Preferred Embodiment 3 in that the acoustic wave device 1i further includes two reflectors 8, similar to the acoustic wave device 1b (see FIG. 17) according to Modification 2 of Preferred Embodiment 1. The configuration of each reflector 8 is the same as or similar to that of each reflector 8 of the acoustic wave device 1b.

The above-described first to third preferred embodiments and the like are merely examples of various preferred embodiments of the present invention. The above-described first to third preferred embodiments and the like can be variously modified according to design and the like as long as the advantageous effects of preferred embodiments of the present invention can be achieved.

For example, in the acoustic wave device 1 according to Preferred Embodiment 1, the piezoelectric layer 4 is bonded to the silicon substrate 2 with the silicon oxide film 7 interposed therebetween. However, the silicon oxide film 7 is not a necessary element.

In addition, in the acoustic wave device 1 according to Preferred Embodiment 1, the cavity 26 penetrates the silicon substrate 2 in the thickness direction thereof, but is not limited thereto. The cavity 26 may not penetrate the silicon substrate 2 and an internal space of a recess may not be provided in the first main surface 21 of the silicon substrate 2.

Further, in the acoustic wave devices 1 to 1j, each of the first electrode 51 and the second electrode 52 has a rectangular or substantially rectangular shape in cross section, but is not limited to having this shape. Here, the cross-sectional shape is, for example, a shape of a cross section orthogonal or substantially orthogonal to the thickness direction D1 of the piezoelectric layer 4 and the second direction D2. For example, the first electrode 51 and the second electrode 52 may have a shape in which a width of a lower end is wider than a width of an upper end as in any of FIGS. 27A to 27D. This makes it possible to increase a capacitance between the first electrode 51 and the second electrode 52 that are adjacent to each other without increasing the widths of the first main surface 511 of the first electrode 51 (see FIG. 2) and the first main surface 521 of the second electrode 52 (see FIG. 2).

Figure 27A:
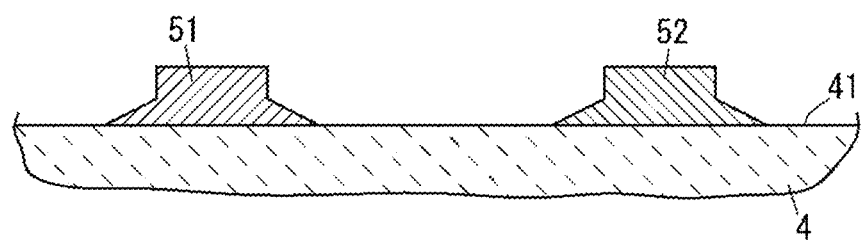
FIGS. 27A to 27D are cross-sectional views illustrating other shapes of a pair of electrodes of an acoustic wave device according to a preferred embodiment of the present invention.
Figure 27B:
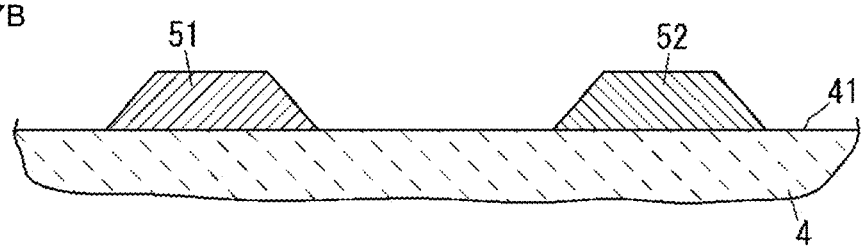
Figure 27C:
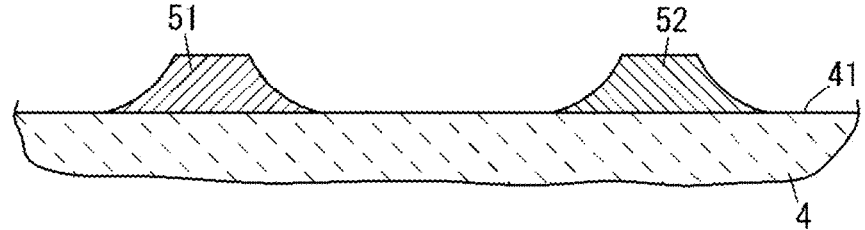
Figure 27D:
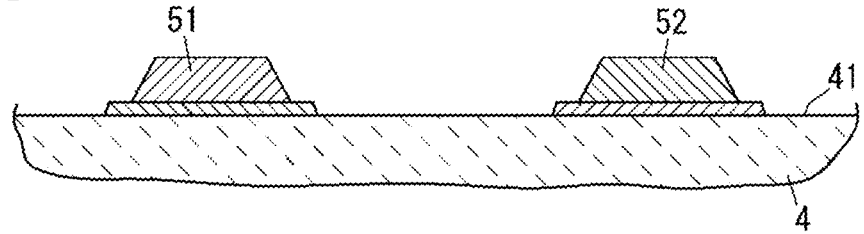

The first electrode 51 and the second electrode 52 illustrated in FIG. 27A include a portion with a constant or substantially constant width on the upper end side and a portion with a gradually increasing width on the lower end side. Further, the first electrode 51 and the second electrode 52 illustrated in FIG. 27B have a trapezoidal or substantially trapezoidal shape in cross section. In addition, the first electrode 51 and the second electrode 52 illustrated in FIG. 27C have a shape spreading toward the end, and both side surfaces in the width direction are curved surfaces. Further, each of the first electrode 51 and the second electrode 52 illustrated in FIG. 27D includes a portion with a trapezoidal or substantially trapezoidal shape in cross section on the upper end side and includes, on the lower end side, a portion having the trapezoidal or substantially trapezoidal shape in cross section wider in width than the portion with the trapezoidal or substantially trapezoidal shape in cross section on the upper end side.

Figure 28A:
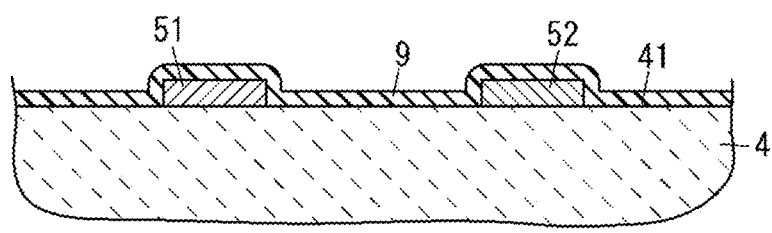
FIGS. 28A to 28C are cross-sectional views illustrating other configuration of an acoustic wave device according to a preferred embodiment of the present invention.
Figure 28B:
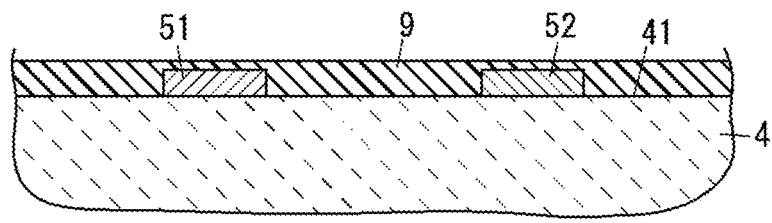
Figure 28C:
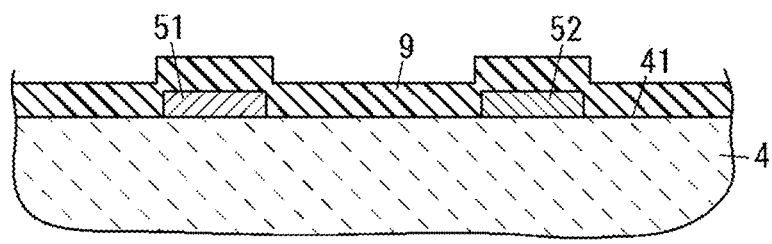

In addition, the acoustic wave devices 1 to 1j may include a dielectric film 9 that covers the first main surface 41 of the piezoelectric layer 4 and the first electrode 51 and the second electrode 52 on the first main surface 41 as illustrated in any of FIGS. 28A to 28C. By including the dielectric film 9, the acoustic wave devices 1 to 1j can increase the capacitance between the first electrode 51 and the second electrode 52 that are adjacent to each other. In FIG. 28A, the dielectric film 9 is thinner than the first electrode 51 and the second electrode 52, and a surface of the dielectric film 9 has an uneven shape along a shape of a base. In FIG. 28B, the surface of the dielectric film 9 is flattened to have a planar shape. In FIG. 28C, the dielectric film 9 is thicker than the first electrode 51 and the second electrode 52, and the surface of the dielectric film 9 has an uneven shape along the shape of the base.

Further, in the acoustic wave devices 1 to 1j, the cross-sectional shape of the first electrode 51 may be different from the cross-sectional shape of the second electrode 52. Here, the cross-sectional shape is, for example, a shape of a cross section orthogonal or substantially orthogonal to the thickness direction D1 of the piezoelectric layer 4 and the second direction D2.

Furthermore, in the acoustic wave devices 1 to 1j, the acoustic wave resonator 5 includes the plurality of first electrodes 51 and the plurality of second electrodes 52. However, the acoustic wave resonator 5 is not limited thereto and may include at least one first electrode 51 and one second electrode 52.

Additionally, in a case where an acoustic wave filter is configured as in the acoustic wave device 1a according to Modification 1 of Preferred Embodiment 1, the first electrode 51 and the second electrode 52 may have different shapes for each acoustic wave resonator 5. Further, the first electrodes 51 and the second electrodes 52 may have different shapes between the acoustic wave resonator 5 of the series arm resonator RS1 and the acoustic wave resonator 5 of the parallel arm resonator RS2.

Further, the first electrode 51 and the second electrode 52 are not limited to being linear in a plan view from the thickness direction D1 of the piezoelectric layer 4. For example, the first electrode 51 and the second electrode 52 may have a curved shape or a shape including a linear portion and a curved portion.

The following features are disclosed in this specification from the above-described preferred embodiments and the like.

An acoustic wave device (1; 1*a*; 1*b*; 1*c*; 1*d*; 1*e*; 1*f*; 1*g*; 1*h*; 1*i*; 1*j*) according to a preferred embodiment of the present invention includes a piezoelectric layer (4), and a first electrode (51) and a second electrode (52). The first electrode (51) and the second electrode (52) face each other in a direction (D2) intersecting with a thickness direction (D1) of the piezoelectric layer (4). The acoustic wave device (1; 1*a*) uses a bulk wave of a thickness-shear primary mode. The acoustic wave device (1; 1*a*; 1*b*; 1*c*; 1*d*; 1*e*; 1*f*; 1*g*; 1*h*; 1*i*; 1*j*) further includes a silicon substrate (2). The silicon substrate (2) includes a first main surface (21) and a second main surface (22) opposed to each other. A material of the piezoelectric layer (4) is lithium niobate or lithium tantalate. The piezoelectric layer (4) is on the first main surface (21) of the silicon substrate (2). The acoustic wave device (1; 1*a*; 1*b*; 1*c*; 1*d*; 1*e*; 1*f*; 1*g*; 1*h*; 1*i*; 1*j*) further includes a trap region (10) in the silicon substrate (2).

With the acoustic wave device (1; 1*a*; 1*b*; 1*c*; 1*d*; 1*e*; 1*f*; 1*g*; 1*h*; 1*i*; 1*j*) according to the above-described preferred embodiment, it is possible to handle higher frequencies and improve linearity.

An acoustic wave device (1; 1*a*; 1*b*; 1*c*; 1*d*; 1*e*; 1*f*; 1*g*; 1*h*; 1*i*; 1*j*) according to a preferred embodiment of the present invention includes a piezoelectric layer (4), and a first electrode (51) and a second electrode (52). The first electrode (51) and the second electrode (52) face each other in a direction (D2) intersecting with a thickness direction (D1) of the piezoelectric layer (4). The first electrode (51) and the second electrode (52) are adjacent to each other. In the acoustic wave device (1; 1*a*), in any cross section along the thickness direction (D1) of the piezoelectric layer (4), d/p is equal to or less than about 0.5, when a distance between center lines of the first electrode (51) and the second electrode (52) is represented by p and a thickness of the piezoelectric layer (4) is represented by d. The acoustic wave device (1; 1*a*; 1*b*; 1*c*; 1*d*; 1*e*; 1*f*; 1*g*; 1*h*; 1*i*; 1*j*) further includes a silicon substrate (2). The silicon substrate (2) includes a first main surface (21) and a second main surface (22) opposed to each other. A material of the piezoelectric layer (4) is lithium niobate or lithium tantalate. The piezoelectric layer (4) is on the first main surface (21) of the silicon substrate (2). The acoustic wave device (1; 1*a*; 1*b*; 1*c*; 1*d*; 1*e*; 1*f*; 1*g*; 1*h*; 1*i*; 1*j*) further includes a trap region (10) in the silicon substrate (2).

With the acoustic wave device (1; 1*a*; 1*b*; 1*c*; 1*d*; 1*e*; 1*f*; 1*g*; 1*h*; 1*i*; 1*j*) according to the above-described preferred embodiment, it is possible to handle higher frequencies and improve linearity.

In an acoustic wave device (1; 1*a*; 1*b*; 1*c*; 1*d*; 1*e*; 1*f*; 1*g*; 1*h*; 1*i*; 1*j*) according to a preferred embodiment of the present invention, d/p is equal to or less than about 0.24.

With the acoustic wave device (1; 1*a*; 1*b*; 1*c*; 1*d*; 1*e*; 1*f*; 1*g*; 1*h*; 1*i*; 1*j*) according to the above-described preferred embodiment, a fractional bandwidth can be further increased.

In an acoustic wave device (1; 1*a*; 1*b*; 1*c*; 1*d*; 1*e*; 1*f*; 1*g*; 1*h*; 1*i*; 1*j*) according to a preferred embodiment of the present invention, the first electrode (51) includes a first electrode main portion (510), and the second electrode (52) includes a second electrode main portion (520). The first electrode main portion (510) intersects with the second electrode (52) in a direction (D2) in which the first electrode (51) and the second electrode (52) face each other. The second electrode main portion (520) intersects with the first electrode (51) in the direction (D2) in which the first electrode (51) and the second electrode (52) face each other. The piezoelectric layer (4) includes a specified region (45) that intersects with both the first electrode (51) and the second electrode (52) in the direction (D2) in which the first electrode (51) and the second electrode (52) face each other and is between the first electrode (51) and the second electrode (52) in a plan view from the thickness direction (D1) of the piezoelectric layer (4). The acoustic wave device (1; 1*a*; 1*b*; 1*c*; 1*d*; 1*e*; 1*f*; 1*g*; 1*h*; 1*i*; 1*j*) satisfies the condition of MR≤1.75×d/p)+0.075. S1 represents an area of the first electrode main portion (510) in a plan view from the thickness direction (D1) of the piezoelectric layer (4). S2 represents an area of the second electrode main portion (520) in a plan view from the thickness direction (D1) of the piezoelectric layer (4). S0 represents an area of the specified region (45) in a plan view from the thickness direction (D1) of the piezoelectric layer (4). MR is a structural parameter defined by (S1+S2)/(S1+S2+S0).

With the acoustic wave device (1; 1*a*; 1*b*; 1*c*; 1*d*; 1*e*; 1*f*; 1*g*; 1*h*; 1*i*; 1*j*) according to the above-described preferred embodiment, it is possible to reduce or prevent a spurious component in a band.

In an acoustic wave device (1; 1*a*; 1*h*; 1*i*; 1*j*) according to a preferred embodiment of the present invention, at least a portion of the first main surface (21) of the silicon substrate (2) is a rough surface (211). The silicon substrate (2) includes a bulk region (2B) and a surface region (2S) including the rough surface (211). The trap region (10) includes the surface region (2S).

In an acoustic wave device (1; 1*a*; 1*h*; 1*i*; 1*j*) according to a preferred embodiment of the present invention, the silicon substrate (2) includes a bulk region (2B) and a surface region (2S) including the first main surface (21) of the silicon substrate (2). The surface region (2S) is an amorphous silicon layer. The trap region (10) includes the surface region (2S).

In an acoustic wave device (1; 1*a*; 1*h*; 1*i*; 1*j*) according to a preferred embodiment of the present invention, the silicon substrate (2) includes a bulk region (2B) and a surface region (2S) including the first main surface (21) of the silicon substrate (2). The surface region (2S) is a polycrystalline silicon layer. The trap region (10) includes the surface region (2S).

In an acoustic wave device (1; 1*a*; 1*h*; 1*i*) according to a preferred embodiment of the present invention, the rough surface (211) does not overlap an acoustic wave resonator (5) including the first electrode (51) and the second electrode (52), and a portion of the piezoelectric layer (4) in a plan view from the thickness direction (D1) of the piezoelectric layer (4).

In an acoustic wave device (1*c*) according to a preferred embodiment of the present invention, the trap region (10) includes an insulating film (silicon nitride film 11) directly on the first main surface (21) of the silicon substrate (2). A weight ratio of oxygen of the insulating film (silicon nitride film 11) is smaller than a weight ratio of oxygen of silicon oxide.

In an acoustic wave device (1c) according to a preferred embodiment of the present invention, the trap region (10) includes an insulating film (silicon nitride film 11) directly on the first main surface (21) of the silicon substrate (2). The insulating film is a silicon nitride film (11).

In an acoustic wave device (1c) according to a preferred embodiment of the present invention, the insulating film (silicon nitride film 11) does not overlap an acoustic wave resonator (5) in a plan view from the thickness direction (D1) of the piezoelectric layer (4). The acoustic wave resonator (5) includes the first electrode (51) and the second electrode (52), and a portion of the piezoelectric layer (4).

With the acoustic wave device (1c) according to the above-described preferred embodiment, it is possible to improve a Q value of resonance characteristics of the acoustic wave resonator (5), compared to a case where the insulating film (silicon nitride film 11) overlaps the acoustic wave resonator (5).

In an acoustic wave device (1; 1a; 1b; 1c) according to a preferred embodiment of the present invention, the silicon substrate (2) includes at least a portion of a cavity (26) on a side opposite to the first electrode (51) and the second electrode (52) with the piezoelectric layer (4) interposed therebetween. The cavity (26) overlaps an entire or substantially an entire region of an acoustic wave resonator (5) in a plan view from the thickness direction (D1) of the piezoelectric layer (4). The acoustic wave resonator (5) includes the first electrode (51) and the second electrode (52), and a portion of the piezoelectric layer (4).

An acoustic wave device (1; 1a; 1b; 1c; 1d; 1e; 1f; 1i) according to a preferred embodiment of the present invention includes a first wiring portion (61) and a second wiring portion (62). The first wiring portion (61) is connected to the first electrode (51). The second wiring portion (62) is connected to the second electrode (52). The silicon substrate (2) includes at least a portion of a gap (27). The gap (27) overlaps a portion of at least one of the first wiring portion (61) and the second wiring portion (62) in a plan view from the thickness direction (D1) of the piezoelectric layer (4). The trap region (10) includes the gap (27).

An acoustic wave device (1d; 1e; 1f; 1i) according to a preferred embodiment of the present invention includes a first wiring portion (61), a second wiring portion (62), and an acoustic reflection layer (3). The first wiring portion (61) is connected to the first electrode (51). The second wiring portion (62) is connected to the second electrode (52). The acoustic reflection layer (3) is provided between the first main surface (21) of the silicon substrate (2) and the piezoelectric layer (4). The acoustic reflection layer (3) includes at least one high acoustic impedance layer (32) and at least one low acoustic impedance layer (31). The at least one low acoustic impedance layer (31) has an acoustic impedance lower than an acoustic impedance of the at least one high acoustic impedance layer (32). The silicon substrate (2) includes at least a portion of a gap (27). The gap (27) overlaps a portion of at least one of the first wiring portion (61) and the second wiring portion (62) in a plan view from the thickness direction (D1) of the piezoelectric layer (4). The trap region (10) includes the gap (27).

An acoustic wave device (1g) according to a preferred embodiment of the present invention includes a first wiring portion (61) and a second wiring portion (62). The first wiring portion (61) is connected to the first electrode (51). The second wiring portion (62) is connected to the second electrode (52). The silicon substrate (2) includes at least a portion of a gap (28). The gap (28) includes a portion positioned within a predetermined distance (L11, L12) from a region overlapping a portion of at least one of the first wiring portion (61) and the second wiring portion (62) in a plan view from the thickness direction (D1) of the piezoelectric layer (4). The predetermined distance (L11, L12) is a distance between either of the first electrode (51) or the second electrode (52) and the silicon substrate (2). The trap region (10) includes the gap (28).

An acoustic wave device (1; 1a; 1b; 1c; 1d; 1e; 1f; 1g; 1h; 1i; 1j) according to a preferred embodiment of the present invention includes a plurality of the first electrodes (51) and a plurality of the second electrodes (52). The plurality of the first electrodes (51) and the plurality of the second electrodes (52) are alternately provided one by one. The plurality of the first electrodes (51) are commonly connected to the first wiring portion (61). The plurality of the second electrodes (52) are commonly connected to the second wiring portion (62).

With an acoustic wave device (1; 1a; 1b; 1c; 1d; 1e; 1f; 1g; 1h; 1i; 1j) according to the above-described preferred embodiment, the Q value can be further increased.

An acoustic wave device (1; 1a; 1b; 1c; 1d; 1e; 1f; 1g; 1h; 1i; 1j) according to a preferred embodiment of the present invention includes a silicon oxide film (7). The silicon oxide film (7) is between the silicon substrate (2) and the piezoelectric layer (4).

An acoustic wave device (1a; 1e; 1f; 1g; 1j) according to a preferred embodiment of the present invention is an acoustic wave filter including a plurality of acoustic wave resonators (5). Each of the plurality of acoustic wave resonators (5) is a resonator including the first electrode (51) and the second electrode (52). The piezoelectric layer (4) is shared by the plurality of acoustic wave resonators (5).

In an acoustic wave device (1; 1a; 1b; 1c; 1d; 1e; 1f; 1g; 1h; 1i; 1j) according to a preferred embodiment of the present invention, the piezoelectric layer (4) includes a first main surface (41) and a second main surface (42) opposed to each other. The first main surface (41) of the piezoelectric layer (4) is on a side opposite to a side of the silicon substrate (2). The second main surface (42) of the piezoelectric layer (4) is on the side of the silicon substrate (2). The first electrode (51) and the second electrode (52) face each other on the first main surface (41) of the piezoelectric layer (4).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric layer;
   a first electrode and a second electrode facing each other in a direction intersecting with a thickness direction of the piezoelectric layer; and
   a silicon substrate including a first main surface and a second main surface opposed to each other; wherein
   the first electrode and the second electrode are adjacent to each other;
   in any cross section along the thickness direction of the piezoelectric layer, when a distance between center lines of the first electrode and the second electrode is represented by p, and a thickness of the piezoelectric layer is represented by d,
   d/p is equal to or less than about 0.5;
   a material of the piezoelectric layer is lithium niobate or lithium tantalate;

the piezoelectric layer includes a first main surface and a second main surface opposed to each other, and provided on the first main surface of the silicon substrate; and a trap region is provided in the silicon substrate.

2. The acoustic wave device according to claim 1, wherein the d/p is equal to or less than about 0.24.

3. The acoustic wave device according to claim 2, wherein the first electrode includes a first electrode main portion intersecting with the second electrode in a direction in which the first electrode and the second electrode face each other;

the second electrode includes a second electrode main portion intersecting with the first electrode in the direction in which the first electrode and the second electrode face each other;

the piezoelectric layer includes a specified region between the first electrode and the second electrode in the direction in which the first electrode and the second electrode face each other on the piezoelectric layer in a plan view from the thickness direction of the piezoelectric layer;

when, in a plan view from the thickness direction of the piezoelectric layer, an area of the first electrode main portion is represented by S1, an area of the second electrode main portion is represented by S2, an area of the specified region is represented by S0, and a structural parameter defined by (S1+S2)/(S1+S2+S0) is represented by MR, the acoustic wave device satisfies MR≤1.75×(d/p)+0.075.

4. The acoustic wave device according to claim 1, wherein at least a portion of the first main surface of the silicon substrate is a rough surface;

the silicon substrate includes a bulk region and a surface region including the rough surface; and the trap region includes the surface region.

5. An acoustic wave device comprising:

a piezoelectric layer;

a first electrode and a second electrode facing each other in a direction intersecting with a thickness direction of the piezoelectric layer; and a silicon substrate including a first main surface and a second main surface opposed to each other; wherein a material of the piezoelectric layer is lithium niobate or lithium tantalate;

the piezoelectric layer is provided on the first main surface of the silicon substrate;

a trap region is provided in the silicon substrate;

at least a portion of the first main surface of the silicon substrate is a rough surface;

the silicon substrate includes a bulk region and a surface region including the rough surface; and the trap region includes the surface region.

6. The acoustic wave device according to claim 5, wherein the rough surface does not overlap an acoustic wave resonator, the acoustic wave resonator including the first electrode and the second electrode, and a portion of the piezoelectric layer, in a plan view from the thickness direction of the piezoelectric layer.

7. The acoustic wave device according to claim 5, wherein the trap region includes an insulating film directly on the first main surface of the silicon substrate; and a weight ratio of oxygen of the insulating film is smaller than a weight ratio of oxygen of silicon oxide.

8. The acoustic wave device according to claim 7, wherein the insulating film does not overlap an acoustic wave resonator, the acoustic wave resonator including the first electrode and the second electrode, and a portion of the piezoelectric layer, in a plan view from the thickness direction of the piezoelectric layer.

9. The acoustic wave device according to claim 5, wherein the trap region includes an insulating film directly on the first main surface of the silicon substrate; and the insulating film is a silicon nitride film.

10. The acoustic wave device according to claim 5, wherein the silicon substrate includes at least a portion of a cavity disposed on a side opposite to the first electrode and the second electrode with the piezoelectric layer interposed between the cavity and the first electrode and the second electrode; and the cavity overlaps an entire or substantially an entire region of an acoustic wave resonator, the acoustic wave resonator including the first electrode and the second electrode, and a portion of the piezoelectric layer, in a plan view from the thickness direction of the piezoelectric layer.

11. The acoustic wave device according to claim 5, further comprising:

a first wiring portion connected to the first electrode; and a second wiring portion connected to the second electrode; wherein the silicon substrate includes at least a portion of a gap overlapping a portion of at least one of the first wiring portion and the second wiring portion in a plan view from the thickness direction of the piezoelectric layer; and the trap region includes the gap.

12. The acoustic wave device according to claim 11, further comprising:

a plurality of the first electrodes and a plurality of the second electrodes; wherein the plurality of the first electrodes and the plurality of the second electrodes are alternately provided one by one;

the plurality of the first electrodes are commonly connected to the first wiring portion; and the plurality of the second electrodes are commonly connected to the second wiring portion.

13. The acoustic wave device according to claim 5, further comprising:

a first wiring portion connected to the first electrode;

a second wiring portion connected to the second electrode; and an acoustic reflection layer between the first main surface of the silicon substrate and the piezoelectric layer; wherein the acoustic reflection layer includes at least one high acoustic impedance layer, and at least one low acoustic impedance layer having an acoustic impedance lower than an acoustic impedance of the at least one high acoustic impedance layer;

the silicon substrate includes at least a portion of a gap overlapping a portion of at least one of the first wiring portion and the second wiring portion in a plan view from the thickness direction of the piezoelectric layer; and the trap region includes the gap.

14. The acoustic wave device according to claim 5, further comprising:

a first wiring portion connected to the first electrode; and a second wiring portion connected to the second electrode; wherein the silicon substrate includes at least a portion of a gap on a side opposite to the first electrode and the second electrode with the piezoelectric layer interposed between the gap and the first electrode and the second electrode;

the gap includes a portion within a predetermined distance from a region overlapping a portion of at least one of the first wiring portion and the second wiring portion in a plan view from the thickness direction of the piezoelectric layer;

the predetermined distance is a distance between the silicon substrate and either of the first electrode or the second electrode; and the trap region includes the gap.

15. The acoustic wave device according to claim 5, further comprising a silicon oxide film between the silicon substrate and the piezoelectric layer.

16. The acoustic wave device according to claim 5, wherein the acoustic wave device is an acoustic wave filter including a plurality of acoustic wave resonators;

each of the plurality of acoustic wave resonators includes the first electrode and the second electrode; and the piezoelectric layer is shared by the plurality of acoustic wave resonators.

17. The acoustic wave device according claim 5, wherein the piezoelectric layer includes a first main surface and a second main surface opposed to each other;

the first main surface of the piezoelectric layer is on a side opposite to a side of the silicon substrate;

the second main surface of the piezoelectric layer is on the side of the silicon substrate; and the first electrode and the second electrode face each other on the first main surface of the piezoelectric layer.

18. An acoustic wave device comprising:

a piezoelectric layer;

a first electrode and a second electrode facing each other in a direction intersecting with a thickness direction of the piezoelectric layer; and a silicon substrate including a first main surface and a second main surface opposed to each other; wherein a material of the piezoelectric layer is lithium niobate or lithium tantalate;

the piezoelectric layer is provided on the first main surface of the silicon substrate;

a trap region is provided in the silicon substrate;

the silicon substrate includes a bulk region and a surface region including the first main surface of the silicon substrate;

the surface region is an amorphous silicon layer; and the trap region includes the surface region.

19. The acoustic wave device according to claim 18, wherein the silicon substrate includes at least a portion of a cavity disposed on a side opposite to the first electrode and the second electrode with the piezoelectric layer interposed between the cavity and the first electrode and the second electrode; and the cavity overlaps an entire or substantially an entire region of an acoustic wave resonator, the acoustic wave resonator including the first electrode and the second electrode, and a portion of the piezoelectric layer, in a plan view from the thickness direction of the piezoelectric layer.

20. An acoustic wave device comprising:

a piezoelectric layer;

a first electrode and a second electrode facing each other in a direction intersecting with a thickness direction of the piezoelectric layer; and a silicon substrate including a first main surface and a second main surface opposed to each other; wherein a material of the piezoelectric layer is lithium niobate or lithium tantalate;

the piezoelectric layer is provided on the first main surface of the silicon substrate;

a trap region is provided in the silicon substrate;

the silicon substrate includes a bulk region, and a surface region including the first main surface of the silicon substrate;

the surface region is a polycrystalline silicon layer; and the trap region includes the surface region.

* * * * *